US011917853B2

(12) United States Patent
You

(10) Patent No.: US 11,917,853 B2
(45) Date of Patent: Feb. 27, 2024

(54) DISPLAY DEVICE HAVING AN OPENING AREA

(71) Applicant: Samsung Display Co., Ltd., Yongin-Si (KR)

(72) Inventor: Chungi You, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 9 days.

(21) Appl. No.: 17/332,945

(22) Filed: May 27, 2021

(65) Prior Publication Data

US 2022/0069255 A1 Mar. 3, 2022

(30) Foreign Application Priority Data

Aug. 25, 2020 (KR) .................. 10-2020-0107419

(51) Int. Cl.
*H10K 50/844* (2023.01)
*H10K 71/00* (2023.01)

(52) U.S. Cl.
CPC ......... *H10K 50/8445* (2023.02); *H10K 71/00* (2023.02)

(58) Field of Classification Search
CPC . H01L 51/5256; H01L 51/56; H01L 51/5231; H01L 27/3234; H01L 27/3276; H01L 51/5203; H01L 27/32; H01L 51/0018; H01L 2251/56
See application file for complete search history.

(56) References Cited

U.S. PATENT DOCUMENTS

| 8,183,067 B2 | 5/2012 | Yamazaki et al. |
| 10,431,762 B2 | 10/2019 | Jung et al. |
| 10,707,438 B2 | 7/2020 | Kwon et al. |
| 2014/0210864 A1* | 7/2014 | Villarreal ................ B81B 3/007 359/230 |
| 2020/0144535 A1* | 5/2020 | Kim .................... H01L 51/5253 |
| 2020/0176520 A1* | 6/2020 | Kim .................... H01L 51/5253 |
| 2020/0212140 A1* | 7/2020 | Huh ..................... H01L 27/326 |
| 2020/0212159 A1* | 7/2020 | Lee ..................... H01L 51/5237 |

FOREIGN PATENT DOCUMENTS

| KR | 10-1166922 B1 | 7/2012 |
| KR | 10-1411960 B1 | 6/2014 |
| KR | 10-2017-0025942 A | 3/2017 |
| KR | 10-2019-0027985 A | 3/2019 |
| KR | 10-2010803 B1 | 9/2019 |

* cited by examiner

*Primary Examiner* — Caleb E Henry
(74) *Attorney, Agent, or Firm* — Innovation Counsel LLP

(57) ABSTRACT

A display device includes: a substrate including an opening area, a display area surrounding the opening area, and a non-display area between the opening area and the display area; a first insulating layer arranged on the substrate and including a first recess in the non-display area; an organic pattern layer arranged on an upper surface of the first insulating layer in the non-display area and including a side wall in contact with a first side wall of the first recess; and a display element arranged on the first insulating layer to overlap the display area and including a first electrode, an emission layer, and a second electrode, wherein the first electrode includes a first layer, a second layer, and a third layer, and the first layer includes at least one of titanium (Ti), titanium nitride (TiN), molybdenum (Mo), and amorphous silicon (a-Si) to which a dopant is added.

11 Claims, 26 Drawing Sheets

DISPLAY DEVICE HAVING AN OPENING AREA

CROSS-REFERENCE TO RELATED APPLICATION

This application claims priority under 35 U.S.C. § 119 to Korean Patent Application No. 10-2020-0107419, filed on Aug. 25, 2020, in the Korean Intellectual Property Office; the Korean Patent Application is incorporated by reference.

BACKGROUND

1. Field

The technical field relates to a display device and a method of manufacturing the display device.

2. Description of the Related Art

Display devices may be included in various electronic devices for displaying images. Since thinner and lighter display devices have been available, applications of display devices have increased.

A display device may include a display area for displaying images. Additional functions may be implemented in a display area.

SUMMARY

In a display device having an opening, moisture may permeate through a side of the opening and may damage elements inside the display device. One or more embodiments may be related to a display device having a structure capable of substantially preventing moisture from permeating through an opening. One or more embodiments may be related to a method of manufacturing the display device.

According to one or more embodiments, a display device includes a substrate including an opening area, a display area surrounding the opening, and a non-display area between the opening area and the display area, a first insulating layer arranged on the substrate and including a first recess indented in a depth direction in the non-display area, an organic pattern layer arranged on an upper surface of the first insulating layer in the non-display area and including a side wall in contact with a first side wall of the first recess, and a display element arranged on the first insulating layer to overlap the display area and including a first electrode, an emission layer, and a second electrode that are sequentially stacked, wherein the first electrode includes a first layer, a second layer, and a third layer that are sequentially stacked, and the first layer includes at least one of titanium (Ti), titanium nitride (TiN), molybdenum (Mo), and amorphous silicon (a-Si) to which a dopant is added.

The display element may include at least one of a first functional layer between the first electrode and the emission layer, and a second functional layer between the emission layer and the second electrode, and the at least one of the first functional layer and the second functional layer, and the second electrode may extend from the display area to the first side wall and are arranged in the first recess and respectively include a first through hole and a second through hole, each of which exposes a portion of the upper surface of the first insulating layer.

The display device may further include a pattern layer arranged between the opening area and the organic pattern layer, the pattern layer including the first layer, the second layer, and the third layer, and the first insulating layer may further include a second recess spaced apart from the first recess and indented in the depth direction, the pattern layer may be between the first recess and the second recess, and the at least one of the first functional layer and the second functional layer may extend from the first recess to the second recess and be arranged in the second recess.

The display device may further include a capping layer arranged on the second electrode, wherein the capping layer extends from the display area to the first side wall and is arranged in the first recess, wherein the capping layer may include a third through hole that exposes a portion of the upper surface of the first insulating layer.

The display device may further include an encapsulation layer covering the display element and including a first inorganic encapsulation layer, an organic encapsulation layer, and a second inorganic encapsulation layer, wherein the first inorganic encapsulation layer and the second inorganic encapsulation layer may extend from the display area to the non-display area, and overlap the first through hole and the second through hole, respectively.

The display device may further include a second insulating layer arranged between the first insulating layer and the first electrode and separated from the organic pattern layer, wherein the organic pattern layer may include a same material as the second insulating layer.

The first layer may include Ti, and the first electrode further may include a lower layer under the first layer, the lower layer including TiN.

The first recess may be arranged closer to the opening than the organic pattern layer is.

The display device may further include a component overlapping the opening area.

According to one or more embodiments, a display device includes a substrate including an opening area, a display area surrounding the opening, and a non-display area between the opening area and the display area, a first insulating layer arranged on the substrate, a display element arranged on the first insulating layer to overlap the display area and including a first electrode, an emission layer, and a second electrode that are sequentially stacked, an encapsulation layer covering the display element and extending from the display element to the non-display area, the encapsulation layer including a first inorganic encapsulation layer, an organic encapsulation layer, and a second inorganic encapsulation layer, and an intermediate pattern layer overlapping the non-display area and arranged between the first insulating layer and the encapsulation layer, wherein the first electrode and the intermediate pattern layer each include amorphous silicon (a-Si) to which a dopant is added.

The display element may include at least one of a first functional layer between the first electrode and the emission layer, and a second functional layer between the emission layer and the second electrode, and the at least one of the first functional layer and the second functional layer, and the second electrode may extend from the display area to the non-display area and respectively include a first through hole and a second through hole that expose the intermediate pattern layer.

According to one or more embodiments, a method of manufacturing a display device includes preparing a display substrate including a substrate and a first insulating layer, the substrate including a non-display area and a display area, and the first insulating layer being arranged on the substrate, forming a first electrode overlapping the display area on the first insulating layer, forming a sacrificial pattern layer on the first insulating layer simultaneously with the first electrode, the sacrificial pattern layer overlapping the non-display area, forming at least one of a first functional layer and a second functional layer, and a second electrode on the first electrode and the sacrificial pattern layer, and removing the at least one of the first functional layer and the second functional layer, and the second electrode, which are arranged on the sacrificial pattern layer.

The forming of the sacrificial pattern layer may include sequentially forming a first layer, a second layer, and a third layer, forming a photoresist pattern on the third layer, etching the second layer and the third layer using the photoresist pattern as a mask, and etching the first layer using the photoresist pattern as a mask.

The etching of the first layer may include forming a recess including one side wall that is in contact with one side wall of the sacrificial pattern layer.

The removing of the at least one of the first functional layer and the second functional layer, and the second electrode, which are arranged on the sacrificial pattern layer, may include forming a first through hole in the at least one of the first functional layer and the second functional layer, the first through hole exposing a portion of an upper surface of the first insulating layer, and forming a second through hole in the second electrode, the second through hole exposing a portion of the upper surface of the first insulating layer.

The method may further include forming an encapsulation layer on the second electrode, the encapsulation layer including a first inorganic encapsulation layer, an organic encapsulation layer, and a second inorganic encapsulation layer, wherein the first inorganic encapsulation layer and the second inorganic encapsulation layer may extend from the display area to the first through hole and the second through hole, and overlap the first through hole and the second through hole, respectively.

The removing of the at least one of the first functional layer and the second functional layer, and the second electrode, which are arranged on the sacrificial pattern layer, may include irradiating laser light onto the sacrificial pattern layer.

The sacrificial pattern layer may include a first layer, a second layer, and a third layer, and the removing of the at least one of the first functional layer and the second functional layer, and the second electrode, which are arranged on the sacrificial pattern layer, may include exposing an upper surface of the first layer by removing the second layer and the third layer.

The method may further include forming a pattern layer on the first insulating layer simultaneously with the first electrode, the pattern layer overlapping the non-display area, forming the at least one of the first functional layer and the second functional layer, and the second electrode on the pattern layer, and removing the second electrode arranged on the pattern layer.

The removing of the second electrode arranged on the pattern layer may include irradiating laser light at a first energy density ($J/cm^2$), and the removing of the at least one of the first functional layer and the second functional layer, and the second electrode that are arranged on the sacrificial pattern layer may include irradiating laser light onto the sacrificial pattern layer at a second energy density ($J/cm^2$), wherein the second energy density may be greater than the first energy density.

DETAILED DESCRIPTION

Figure 1:
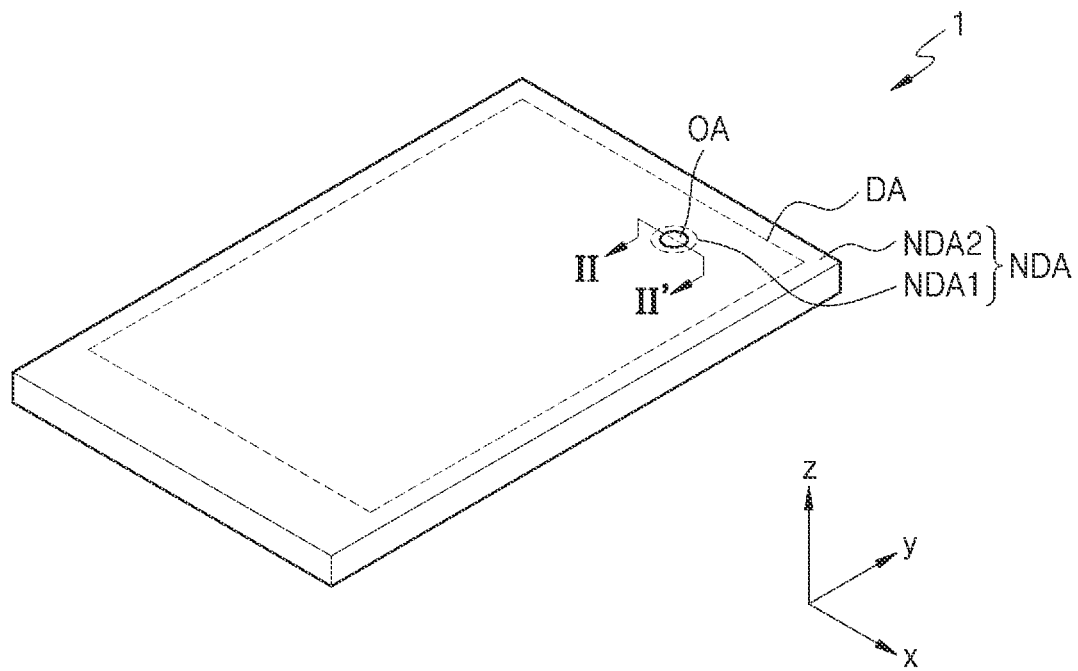
FIG. 1 is a schematic perspective view of a display device according to an embodiment.

Example embodiments are described with reference to the accompanying drawings, wherein like reference numerals may refer to like elements.

The described example embodiments are illustrative. Practical embodiments may be embodied in various forms.

While the terms "first," "second," etc. may be used to describe various elements, the elements may not be limited to the terms. The terms may be used to distinguish one element from another. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

The singular forms "a," "an," and "the" may also indicate the plural forms unless the context clearly indicates otherwise.

The terms "comprise," "comprising," "include" and/or "including" may specify the presence of stated features or components but may not preclude the addition of one or more other features or components.

When a first element is referred to as being "on" a second element, the first element can be directly or indirectly on the second element.

Dimensions in the drawings may be exaggerated or reduced for convenience of explanation.

When an embodiment may be implemented differently, a certain process order may be performed differently from the described order. For example, two consecutively described processes may be performed substantially at the same time or performed in an order opposite to the described order.

The term "connect" may mean "electrically connect" or "electrically connected through no intervening transistor." The term "insulate" may mean "electrically insulate" or "electrically isolate." The term "conductive" may mean "electrically conductive." The term "drive" may mean "operate" or "control." A listing of materials/elements may mean at least one of the listed materials/elements. The expression that an element overlaps an opening may mean that the element is exposed by the opening or overlaps or corresponds to the position of the opening.

A display device displays an image and may be included in a portable electronic device such as a game console, a multimedia device, or an ultra-small personal computer (PC). A display device may be/include at least one of a liquid crystal display, an electrophoretic display, an organic light-emitting display, an inorganic light-emitting display, a field emission display, a surface-conduction electron-emitter display, a quantum dot display, a plasma display, a cathode ray display, and the like. Organic light-emitting display devices are described as examples, and embodiments may be applicable to other types of display devices.

FIG. 1 is a schematic perspective view of a display device 1 according to an embodiment.

Referring to FIG. 1, the display device 1 may include a display area DA, a non-display area NDA, and an opening area OA (or transmission area OA). Light may be emitted from the display area DA. A plurality of pixels may be arranged in the display area DA, and the display device 1 may display an image using light emitted from the pixels. No light-emitting pixels may be arranged in the non-display area NDA. The non-display area NDA may be arranged adjacent to the display area DA.

The opening area OA may be at least partially surrounded by the display area DA. In an embodiment, the opening area OA may be entirely surrounded by the display area DA in a plan view of the display device 1.

The non-display area NDA may include a first non-display area NDA1 and a second non-display area NDA2. The first non-display area NDA1 may surround the opening area OA. The second non-display area NDA2 may at least partially surround the display area DA. In an embodiment, the first non-display area NDA1 may entirely surround the opening area OA in a plan view of the display device 1. The display area DA may entirely surround the first non-display area NDA1 in the plan view of the display device 1. The second non-display area NDA2 may entirely surround the display area DA in the plan view of the display device 1.

Figure 2:
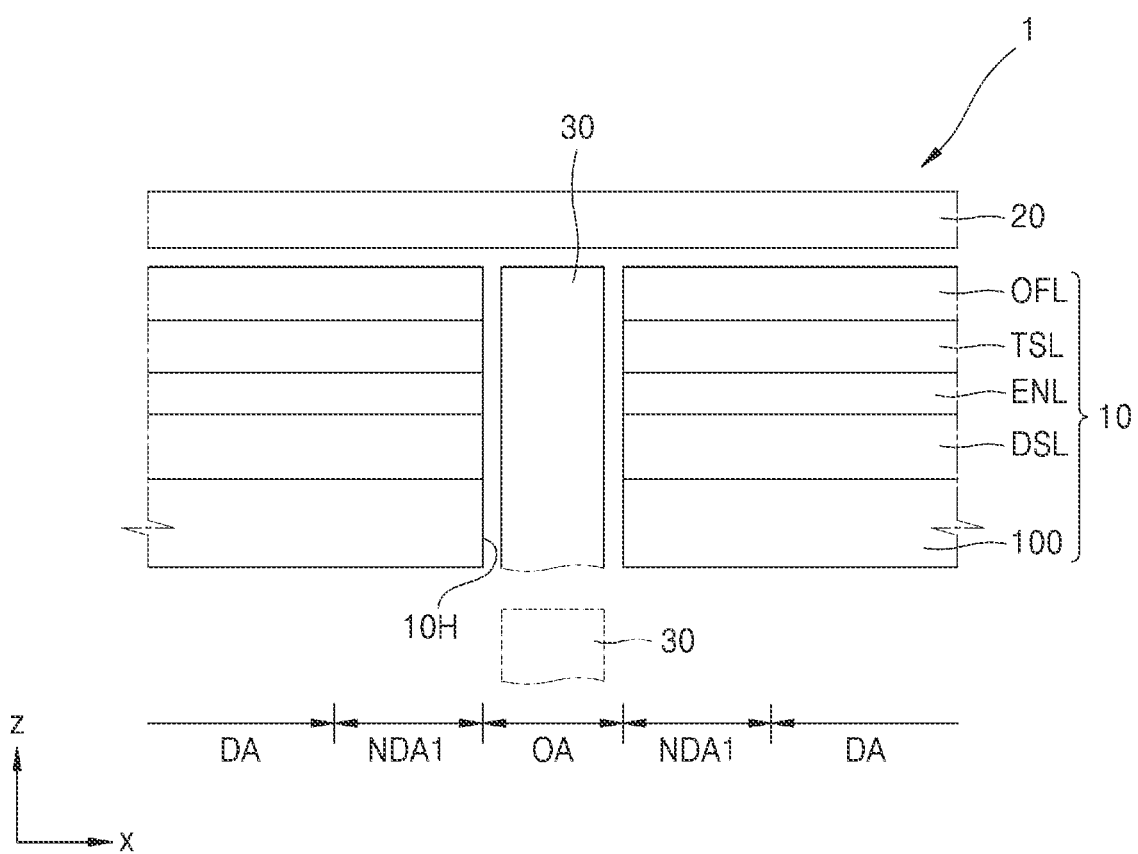
FIG. 2 is a schematic cross-sectional view of a display device according to an embodiment.

FIG. 2 is a schematic cross-sectional view of a display device 1 according to an embodiment. FIG. 2 may correspond to a portion of the display device 1 taken along a line II-II' of FIG. 1.

Referring to FIG. 2, the display device 1 may include a display panel 10, a cover window 20, and a component 30. The display panel 10 may display an image. The display panel 10 may include pixels arranged in the display area DA.

Each of the pixels may include a display element and a pixel circuit connected to the display element. The display element may include an organic light-emitting diode, an inorganic light-emitting diode, or a quantum dot organic light-emitting diode.

The display panel 10 may include a substrate 100 and a multilayer film arranged on the substrate 100. The display area DA, the first non-display area NDA1, and the opening area OA may be defined in the substrate 100 and/or the multilayer film. For example, the substrate 100 may include the display area DA, the first non-display area NDA1, and the opening area OA.

The display panel 10 may include a substrate 100, a display layer DSL, an encapsulation layer ENL, a touch sensor layer TSL, and an optical functional layer OFL. The substrate 100 may include glass or a polymer resin, such as at least one of polyethersulfone, polyacrylate, polyetherimide, polyethylene naphthalate, polyethylene terephthalate, polyphenylene sulfide, polyimide, polycarbonate, cellulose triacetate, cellulose acetate propionate, etc. The substrate 100 may have a multilayer structure including a base layer (not shown) including the above-described polymer resin and a barrier layer (not shown). The substrate 100 may be flexible, rollable, or bendable.

The display layer DSL may be arranged on the substrate 100. The display layer DSL may include a pixel circuit layer including a plurality of pixel circuits, and may include a display element layer including a plurality of display elements. The pixel circuits may be connected to the display elements, respectively. Each of the pixel circuits may include a thin-film transistor and a storage capacitor. Accordingly, the display layer DSL may include the display elements, the thin-film transistors, and the storage capacitors. The display layer DSL may further include insulating layers.

The encapsulation layer ENL may be arranged on the display layer DSL. The encapsulation layer ENL may be arranged on the display elements and may cover the display elements. The encapsulation layer ENL may include at least one inorganic encapsulation layer and at least one organic encapsulation layer. The at least one inorganic encapsulation layer may include at least one of aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. The polymer-based material may include at least one of an acrylic resin, an epoxy resin, a polyimide, and a polyethylene. The at least one organic encapsulation layer may include acrylate.

The touch sensor layer TSL may be arranged on the encapsulation layer ENL. The touch sensor layer TSL may sense an external input, for example, coordinate information corresponding to a touch event. The touch sensor layer TSL may include a sensor electrode and touch wiring lines connected to the sensor electrode. The touch sensor layer TSL may sense an external input using a self-capacitance method or a mutual capacitance method.

The touch sensor layer TSL may be formed on the encapsulation layer ENL. The touch sensor layer TSL may be separately formed on a touch substrate, and then bonded to the encapsulation layer ENL through an adhesive layer such as an optically transparent adhesive. The touch sensor layer TSL may be directly formed on the encapsulation layer ENL, and no adhesive layer may be between the touch sensor layer TSL and the encapsulation layer ENL.

The optical functional layer OFL may be arranged on the touch sensor layer TSL. The optical functional layer OFL may reduce the reflectance of light (external light) incident from the outside toward the display device 1, and/or may improve color purity of light emitted from the display device 1. The optical functional layer OFL may include a retarder and a polarizer. The retarder may include a film type retarder or a liquid crystal coating type retarder, and may include a λ/2 retarder and/or a λ/4 retarder. The polarizer may include a film type polarizer or a liquid crystal coating type polarizer. The film type polarizer may include a stretched synthetic resin film, and the liquid crystal coating type polarizer may include liquid crystals having predetermined orientations. The retarder and polarizer may each further include a protective film.

The optical functional layer OFL may include a black matrix and color filters. The color filters may be arranged in consideration of a color of light emitted by each of pixels of the display device 1. Each of the color filters may include a red, green, or blue pigment or dye. Each of the color filters may include quantum dots in addition to the aforementioned pigment or dye. Some of the color filters may not include the aforementioned pigments or dyes, and may include scattering particles such as titanium oxide.

The optical functional layer OFL may include a destructive interference structure. The destructive interference structure may include a first reflective layer and a second reflective layer. First reflected light and second reflected light respectively reflected from the first reflective layer and the second reflective layer may interfere with each other, and accordingly, the reflectance of external light may be reduced.

The display panel 10 may include an opening 10H. The substrate 100 may include the opening area OA. The display layer DSL, the encapsulation layer ENL, the touch sensor layer TSL, and optical functional layer OFL may include a first opening, a second opening, a third opening, and a fourth opening, respectively. The opening area OA and the first to fourth openings may overlap each other to form the opening 10H of the display panel 10. At least one of the substrate 100, the display layer DSL, the encapsulation layer ENL, the touch sensor layer TSL, and the optical functional layer OFL may not include an opening. For example, one or two of the substrate 100, the display layer DSL, the encapsulation layer ENL, the touch sensor layer TSL, and the optical functional layer OFL may not include an opening.

A cover window 20 may be arranged on the display panel 10. The cover window 20 may protect the display panel 10. The cover window 20 may include at least one of glass, sapphire, or plastic. The cover window 20 may include ultra-thin glass (UTG) or colorless polyimide (CPI).

The component 30 may overlap the opening area OA. The component 30 may be positioned inside the opening 10H of the display panel 10 as illustrated by a solid line in FIG. 2, or may be arranged under the display panel 10 as illustrated by a dotted line in FIG. 2.

The component 30 may include an electronic element. The component 30 may include an electronic element using light or sound. The electronic element may include at least one of a sensor such as an infrared sensor that receives and uses light, a camera that receives light to capture an image, a sensor that outputs and senses light or sound to measure a distance or recognize a fingerprint, a small lamp that outputs light, and a speaker that outputs sound. The electronic element using light may use light in one or more wavelength bands such as at least one of visible light, infrared light, and ultraviolet light. The opening 10H of the display panel 10 may be a transmissive portion through which light and/or sound may be transmitted from or to the component 30.

When the display device 1 is used as a smartwatch or an instrument panel for a vehicle, the component 30 may be a member (such as a clock hand or a needle) indicating certain information (e.g., a vehicle speed, etc.). The component 30 may pass through the cover window 20 and may be exposed to the outside. The cover window 20 may include an opening overlapping the opening 10H of the display panel 10.

The component 30 may include an element related to the functions of the display panel 10 and/or may include an elements such as an accessory that improves the aesthetics of the display panel 10.

Figure 3:
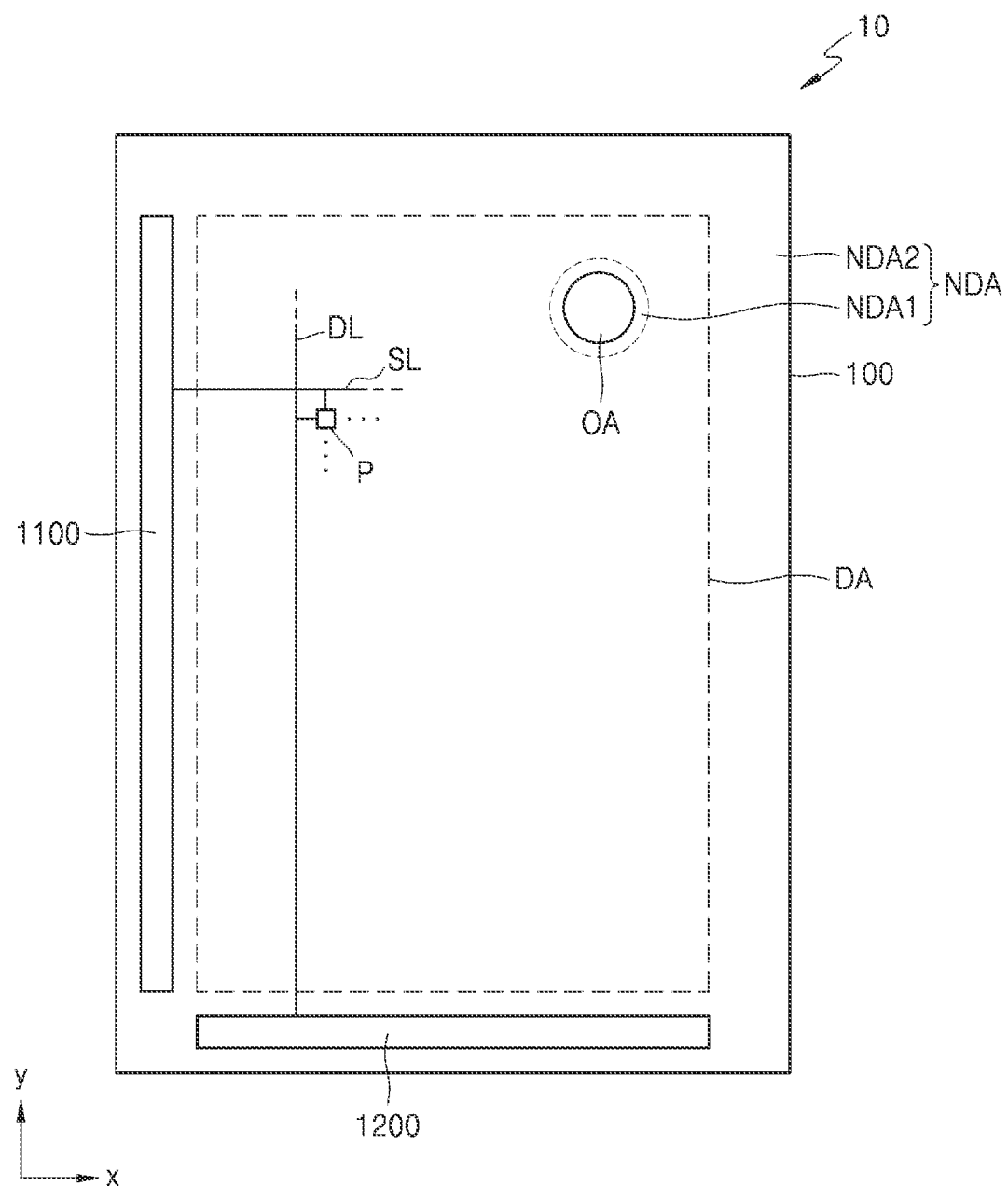
FIG. 3 is a schematic plan view of a display panel according to an embodiment.
Figure 4:
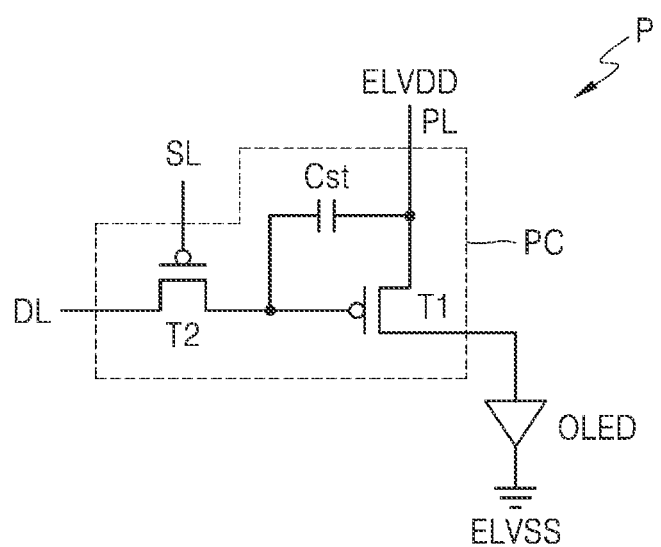
FIG. 4 is a schematic equivalent circuit diagram of a pixel of a display panel according to an embodiment.

FIG. 3 is a schematic plan view of a display panel 10 according to an embodiment. FIG. 4 is a schematic equivalent circuit diagram of a pixel P of a display panel according to an embodiment.

Referring to FIG. 3, the display panel 10 may include the display area DA, the non-display area NDA, and the opening area OA. The display area DA, the non-display area NDA, and the opening area OA may be defined in the substrate 100 of the display panel 10. The substrate 100 may include the display area DA, the non-display area NDA, and the opening area OA. The non-display area NDA may include a first non-display area NDA1 surrounding the opening area OA, and a second non-display area NDA2 at least partially surrounding the display area DA.

The display panel 10 may include a plurality of pixel P arranged in the display area DA. Each pixel P may include a pixel circuit PC and an organic light-emitting diode OLED as a display element connected to the pixel circuit PC, as shown in FIG. 4. The pixel circuit PC may include a driving thin-film transistor T1, a switching thin-film transistor T2, and a storage capacitor Cst. Each pixel P may emit, for example, red, green, blue, or white light using the organic light-emitting diode OLED.

The switching thin-film transistor T2 is connected to a scan line SL and a data line DL, and may transfer, to the driving thin-film transistor T1, a data voltage or a data signal input from the data line DL according to a switching voltage or a switching signal input from the scan line SL.

The storage capacitor Cst is connected to the switching thin-film transistor T2 and a driving voltage line PL, and may store a voltage corresponding to a difference between the voltage transferred from the switching thin-film transistor T2 and a first power voltage ELVDD supplied to the driving voltage line PL.

The driving thin-film transistor T1 is connected to the driving voltage line PL and the storage capacitor Cst, and may control a driving current flowing through the organic light-emitting diode OLED from the driving voltage line PL in response the voltage stored in the storage capacitor Cst.

The organic light-emitting diode OLED may emit light having a certain luminance according to the driving current. A second electrode of the organic light-emitting diode OLED may receive a second power voltage ELVSS.

Although FIG. 4 shows that the pixel circuit PC includes two thin-film transistors and one storage capacitor, the number of thin-film transistors and the number of storage capacitors may be configured based on the design of the pixel circuit PC.

Referring to FIG. 3 again, the first non-display area NDA1 may surround the opening area OA. The first non-display area NDA1 may be an area in which no display element such as an organic light-emitting diode that emits light are disposed. The first non-display area NDA1 may accommodate signal lines that provide a signal to pixels P around the opening area OA.

The second non-display area NDA2 may accommodate a scan driver 1100 that provides a scan signal to each pixel P, a data driver 1200 that provides a data signal to each pixel P, and a main power wiring line (not shown) that provides a first power voltage and/or a second power voltage. The data driver 1200 may be arranged adjacent to one side of the substrate 100. The data driver 1200 may be arranged on a flexible printed circuit board (FPCB) electrically connected to a pad arranged on one side of the display panel 10.

Figure 5:
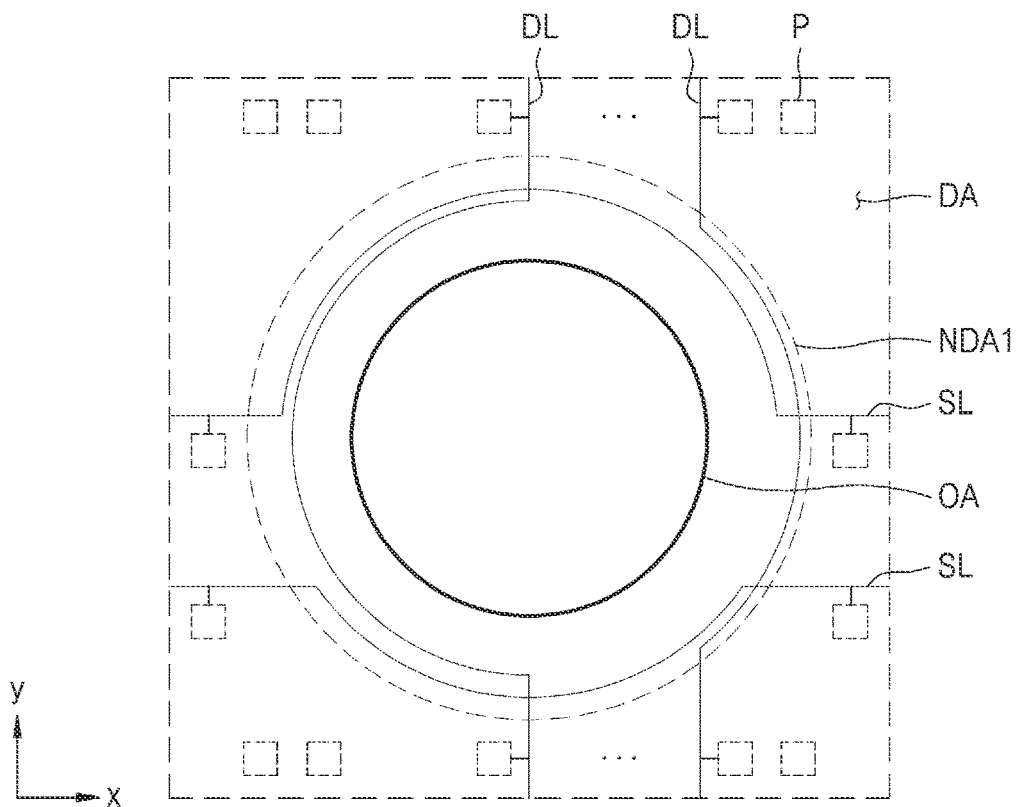
FIG. 5 is a schematic plan view of a portion of a display panel according to an embodiment.

FIG. 5 is a schematic plan view of a portion of a display panel according to an embodiment. FIG. 5 schematically illustrates signal lines arranged in the first non-display area NDA1.

Referring to FIG. 5, a pixel P may be arranged in the display area DA. The pixel P may be connected to a scan line SL and a data line DL. The first non-display area NDA1 may be between the opening area OA and the display area DA (or the pixel P).

Pixels P may be spaced apart from each other at opposite sides with respect to the opening area OA. Pixels P may be spaced apart from each other in a vertical direction at opposite sides with respect to the opening area OA. Pixels P may be spaced apart from each other in a lateral direction at opposite sides with respect to the opening area OA.

Signal lines adjacent to the opening area OA for supplying signals to corresponding pixels P may bypass the opening area OA. Some data lines DL may include straight sections positioned at the display area DA and extending in a y-direction to provide data signals to pixels P arranged at opposite sides of the opening area OA, and may include curved sections bypassing an edge of the opening area OA. Some scan lines SL may include straight sections positioned at the display area DA and extending in an x-direction to provide scan signals to pixels P arranged at opposite sides of the opening area OA, and may include curved sections bypassing the edge of the opening area OA.

Figure 6:
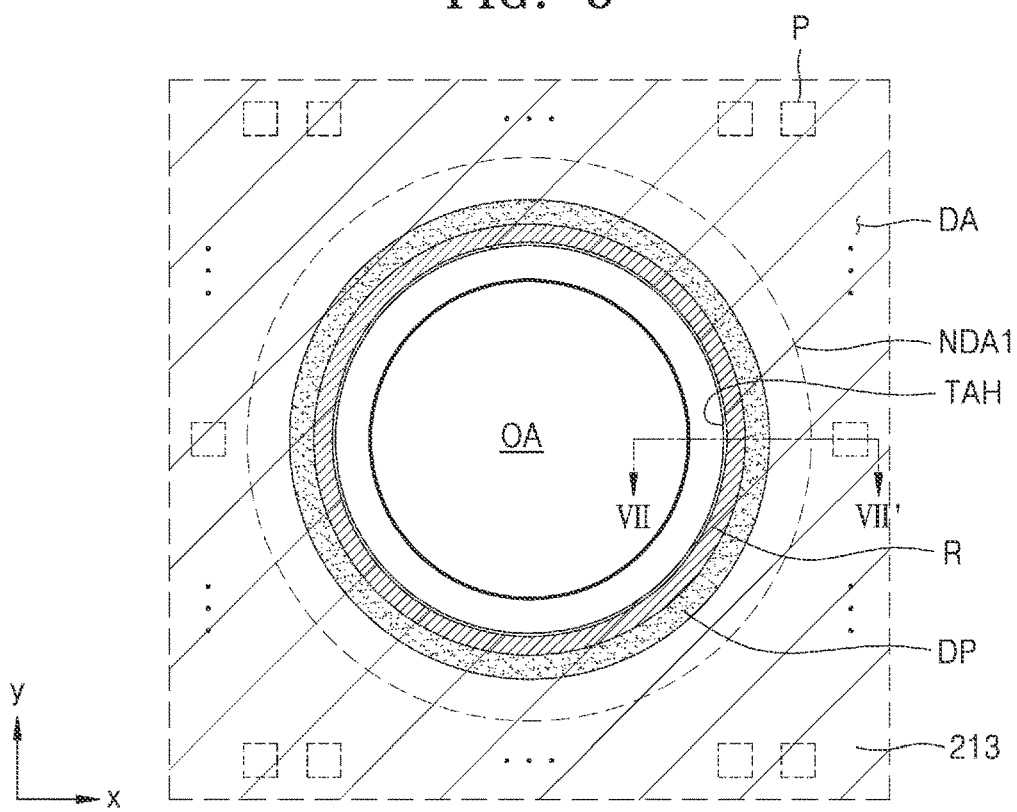
FIG. 6 is a schematic plan view of a portion of a display panel according to an embodiment.

FIG. 6 is a plan view of a portion of a display panel according to an embodiment. FIG. 6 illustrates a recess R and a dam DP arranged in the first non-display area NDA1. A second electrode 213 arranged in the first non-display area NDA1 and the display area DA is shown.

Referring to FIG. 6, at least one dam DP may be between the opening area OA and the display area DA (or the pixels P), and a recess R may be between the dam DP and the opening area OA. The recess R may be arranged on one side of a dam DP that is closest to the opening area OA among multiple dams DP. A dam DP refers to an element/structure protruding from a reference surface. A recess R refers to an element/structure that is concave (or recessed) with respect to the reference surface. The reference surface may be an upper surface of one of insulating layers arranged above a substrate. For example, the dam DP may protrude from an upper surface of a first insulating layer among the insulating layers arranged above the substrate, and the recess R may be indented in a depth/thickness direction of the first insulating layer arranged above the substrate.

The second electrode 213, a first functional layer, and a second functional layer including an organic material are partially removed from an area between the recess R and the opening area OA, for preventing moisture from penetrating through the opening area OA to reach the pixels P. The first functional layer, the second functional layer, and the second electrode 213 may include a through hole TAH that exposes the opening area OA and a portion of the first non-display area NDA1 arranged around the opening area OA. The through hole TAH may expose a portion of the first non-display area NDA1 between the recess R and the opening area OA.

The dam DP and the recess R may each have a ring shape that entirely surrounds the opening area OA. Each of the dam DP and the recess R may have a diameter greater than a diameter of the opening area OA. The dam DP and the recess R may be arranged adjacent to each other. Sidewalls of the dam DP and the recess R may contact each other.

Figure 7A:
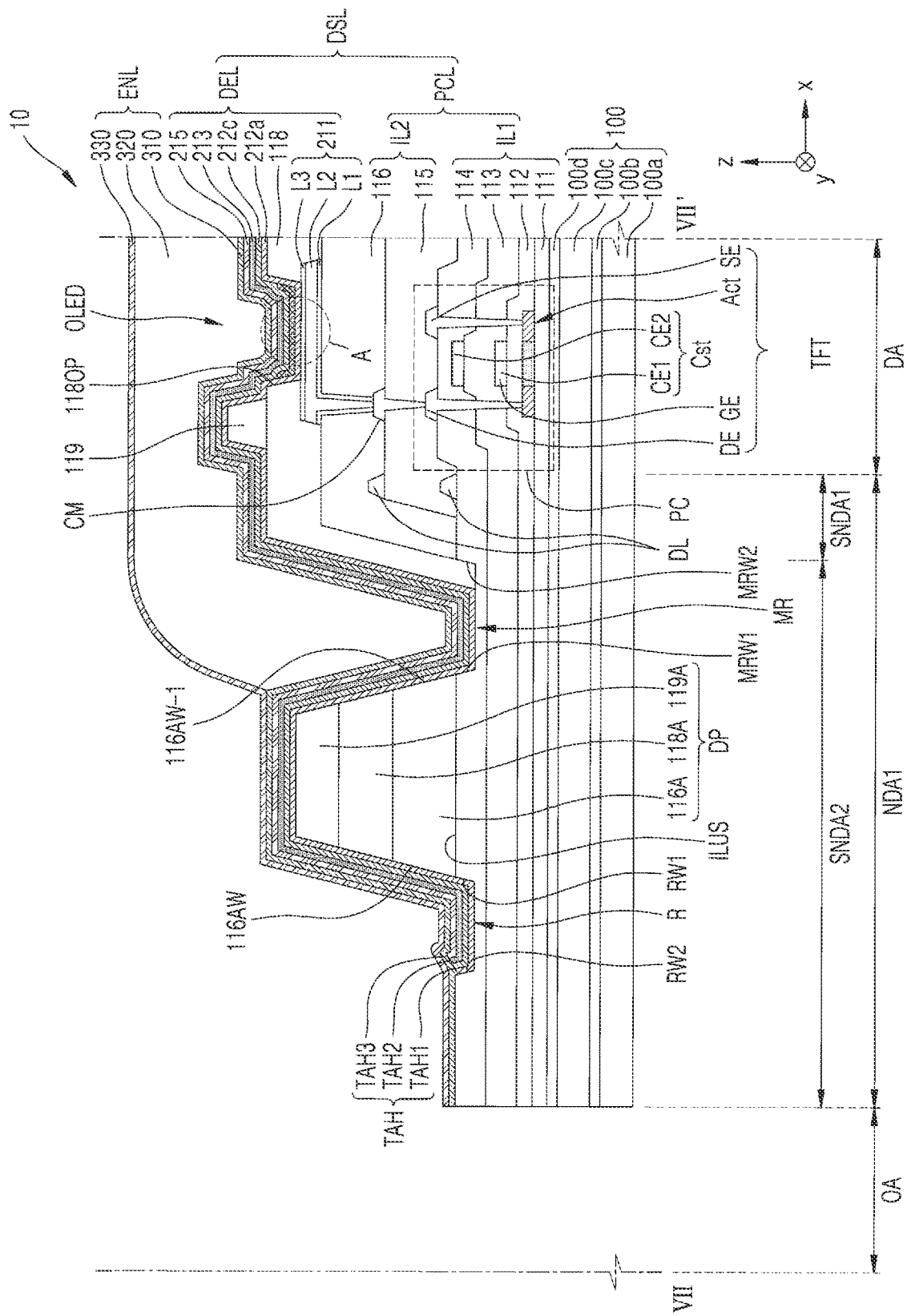
FIG. 7A is a schematic cross-sectional view of a display panel taken along a line VII-VII' of FIG. 6 according to an embodiment.
Figure 7B:
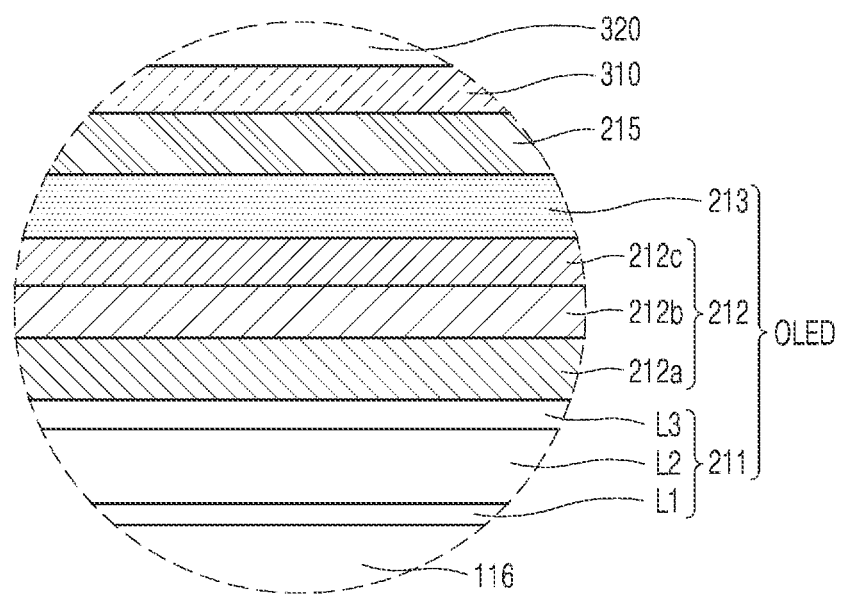
FIG. 7B is an enlarged view of a region A of FIG. 7A according to an embodiment.

FIG. 7A is a schematic cross-sectional view of a display panel 10 taken along a line VII-VII' of FIG. 6 according to an embodiment. FIG. 7B is an enlarged view of a region A of FIG. 7A according to an embodiment.

Referring to FIGS. 7A and 7B, the display panel 10 may include the substrate 100, the display layer DSL, and the encapsulation layer ENL. The display layer DSL may include a pixel circuit layer PCL and a display element layer DEL. The pixel circuit layer PCL may include a first insulating layer IL1, a second insulating layer IL2, the pixel circuit PC, and the data line DL. The display element layer DEL may include the organic light-emitting diode OLED, a pixel-defining layer 118, a spacer 119, and a capping layer 215.

The substrate 100 may include the display area DA, the first non-display area NDA1, and the opening area OA. The first non-display area NDA1 may be between the display area DA and the opening area OA.

The substrate 100 may include a first base layer 100*a*, a first barrier layer 100*b*, a second base layer 100*c*, and a second barrier layer 100*d*. The first base layer 100*a*, the first barrier layer 100*b*, the second base layer 100*c*, and the second barrier layer 100*d* may be sequentially stacked. Each of the first base layer 100*a*, the first barrier layer 100*b*, the second base layer 100*c*, and the second barrier layer 100*d* may be continuous in the display area DA and the first non-display area NDA1.

At least one of the first base layer 100*a* and the second base layer 100*c* may include a polymer resin such as at least one of polyethersulfone, polyarylate, polyetherimide, polyethylene naphthalate, polyethylene terephthalate, polyphenylene sulfide, polyimide, polycarbonate, cellulose triacetate, cellulose acetate propionate, etc.

The first barrier layer 100*b* and the second barrier layer 100*d* may prevent penetration of foreign matter from the outside, and may include a single layer or multiple layers including an inorganic material such as silicon nitride ($SiN_x$), silicon oxide ($SiO_2$), and/or silicon oxynitride (SiON).

The display layer DSL may be arranged on the substrate 100. The first insulating layer IL1 of the display layer DSL may include a buffer layer 111, a first gate insulating layer 112, a second gate insulating layer 113, and an interlayer insulating layer 114. The first insulating layer IL1 may be arranged in the display area DA and the first non-display area NDA1. The pixel circuit PC may be arranged in the display area DA. The pixel circuit PC may include a thin-film transistor TFT and a storage capacitor Cst.

The buffer layer 111 may be arranged on the substrate 100. The buffer layer 111 may include an inorganic insulating material such as at least one of $SiN_x$, SiON, and $SiO_2$, and may include a single layer or multiple layers.

The thin-film transistor TFT may include a semiconductor layer Act, and the semiconductor layer Act may be arranged on the buffer layer 111. The semiconductor layer Act may include polysilicon. The semiconductor layer Act may include amorphous silicon, an oxide semiconductor, or an organic semiconductor. The semiconductor layer Act may include a channel region, and a drain region and a source region respectively arranged on opposite sides of the channel region. A gate electrode GE may overlap the channel region.

The gate electrode GE may include a low-resistance metal material. The gate electrode GE may include a conductive material such as molybdenum (Mo), aluminum (Al), copper (Cu), and titanium (Ti), and may include a single layer or multiple layers.

The first gate insulating layer 112 between the semiconductor layer Act and the gate electrode GE may include an inorganic insulating material such as silicon oxide ($SiO_2$), $SiN_x$, SiON, aluminum oxide ($Al_2O_3$), titanium oxide ($TiO_2$), tantalum oxide ($Ta_2O_5$), hafnium oxide ($HfO_2$), or zinc oxide (ZnO).

The second gate insulating layer 113 may cover the gate electrode GE. The second gate insulating layer 113 may include an inorganic insulating material such as $SiO_2$, $SiN_x$, SiON, $Al_2O_3$, $TiO_2$, $Ta_2O_5$, $HfO_2$, or ZnO.

An upper electrode CE2 of a storage capacitor Cst may be arranged on the second gate insulating layer 113. The upper electrode CE2 may overlap the gate electrode GE. The gate electrode GE and the upper electrode CE2, with the intervening second gate insulating layer 113, may form the storage capacitor Cst. The gate electrode GE may function as a lower electrode CE1 of the storage capacitor Cst.

The storage capacitor Cst may overlap the thin-film transistor TFT. In some embodiments, the storage capacitor Cst may not overlap the thin-film transistor TFT.

The upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may include a single layer or multiple layers.

The interlayer insulating layer 114 may cover the upper electrode CE2. The interlayer insulating layer 114 may include $SiO_2$, $SiN_x$, SiON, $Al_2O_3$, $TiO_2$, $Ta_2O_5$, $HfO_2$, or ZnO. The interlayer insulating layer 114 may include a single layer or multiple layers.

A drain electrode DE and a source electrode SE may be located on the interlayer insulating layer 114. Each of the drain electrode DE and the source electrode SE may be connected to the semiconductor layer Act through a contact hole provided in the first gate insulating layer 112, the second gate insulating layer 113, and the interlayer insulating layer 114. The drain electrode DE and the source electrode SE may each include a material having good conductivity. The drain electrode DE and the source electrode SE may each include a conductive material including Mo, Al, Cu, Ti, and the like, and may each include a single layer or multiple layers. The drain electrode DE and the source electrode SE may each have a multilayer structure of Ti—Al—Ti.

The second insulating layer IL2 may be arranged on the first insulating layer IL1. The second insulating layer IL2 may include a first organic insulating layer 115 and a second organic insulating layer 116. The first organic insulating layer 115 may cover the drain electrode DE and the source electrode SE. The first organic insulating layer 115 may include an organic insulating material including a general purpose polymer such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or a blend of some of the above materials.

A connection electrode CM may be arranged on the first organic insulating layer 115. The connection electrode CM may be connected to the drain electrode DE or the source electrode SE through a contact hole of the first organic insulating layer 115. The connection electrode CM may include a material having good conductivity. The connection electrode CM may include a conductive material including Mo, Al, Cu, or Ti, and may include multiple layers or a single layer. The connection electrode CM may have a multilayer structure of Ti—Al—Ti.

The second organic insulating layer 116 may cover the connection electrode CM. The second organic insulating layer 116 may include an organic insulating material including a general purpose polymer such as PMMA or PS, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or a blend of some of the above materials.

The organic light-emitting diode OLED may be arranged on the second organic insulating layer 116. The organic light-emitting diode OLED may emit red, green, blue, or white light. The organic light-emitting diode OLED may include a first electrode 211, an intermediate layer 212, and (a portion of) the second electrode 213. The first electrode 211 may be a pixel electrode of the organic light-emitting diode OLED, and the second electrode 213 may be an opposite electrode of the organic light-emitting diode OLED.

The first electrode 211 may be arranged on the second organic insulating layer 116. The first electrode 211 may be electrically connected to the connection electrode CM through a contact hole of the second organic insulating layer 116.

The first electrode 211 may include a first layer L1, a second layer L2, and a third layer L3, which are sequentially stacked. In an embodiment, a reflectance of the first layer L1 may be less than a reflectance of the second layer L2. For example, the first layer L1 may include a material having an infrared reflectance lower than an infrared reflectance of the second layer L2.

The first layer L1 may include Ti. The first layer L1 may include titanium nitride (TiN). The first layer L1 may include Mo. The first layer L1 may include amorphous silicon (a-Si) to which a dopant is added. The dopant may be/include at least one of boron (B), phosphorus (P), nitrogen (N), nickel (Ni), cobalt (Co), and fluorine (F). The second layer L2 may include a reflective layer including Ag, Mg, Al, Pt, Pd, Au, Ni, Nd, Ir, Cr, or a compound or alloy thereof. The third layer L3 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The pixel-defining layer 118 may include an opening 1180P that exposes a central portion of the first electrode 211 and may be arranged on the first electrode 211. The pixel-defining layer 118 may include an organic insulating material and/or an inorganic insulating material. The opening 1180P of the pixel-defining layer 118 may define an emission area of light emitted from the organic light-emitting diode OLED. A width of the opening 1180P may correspond to (and may be equal to) a width of the emission area.

The spacer 119 may be arranged on the pixel-defining layer 118. The spacer 119 may include an organic insulating material such as polyimide. The spacer 119 may include an inorganic insulating material such as $SiN_x$ or $SiO_2$, or may include an organic insulating material and an inorganic insulating material.

The spacer 119 may include a material different from a material of the pixel-defining layer 118. The spacer 119 may include a same material as the pixel-defining layer 118. The pixel-defining layer 118 and the spacer 119 may be simultaneously formed during a mask process that uses a half-tone mask, etc.

The intermediate layer 212 may be arranged on the pixel-defining layer 118. The intermediate layer 212 may include an emission layer 212b arranged in the opening 1180P of the pixel-defining layer 118. The emission layer 212b may include a polymer organic material or a low molecular weight organic material, which emits light of a certain color.

The intermediate layer 212 may include at least one of a first functional layer 212a between the first electrode 211 and the emission layer 212b and a second functional layer 212c between the emission layer 212b and the second electrode 213. The first functional layer 212a may be between the first electrode 211 and the emission layer 212b, and the second functional layer 212c may be optional. The first functional layer 212a may be optional, and the second functional layer 212c may be between the emission layer 212b and the second electrode 213.

The first functional layer 212a may include, for example, a hole transport layer (HTL), or may include an HTL and a hole injection layer (HIL). The second functional layer 212c may include an electron transport layer (ETL) and/or an electron injection layer (EIL). The first functional layer 212a and/or the second functional layer 212c may cover an entire surface of the substrate 100.

The second electrode 213 may include a conductive material having a relatively low work function. The second electrode 213 may include a (semi-)transparent layer including Ag, Mg, Al, Pt, Pd, Au, Ni, Nd, Ir, Cr, Li, Ca, or an alloy thereof. The second electrode 213 may include a layer of ITO, IZO, ZnO, or $In_2O_3$ on the (semi-)transparent layer.

The capping layer 215 may be positioned on the second electrode 213. The capping layer 215 may include lithium fluoride (LiF), an inorganic material, and/or an organic material.

The first non-display area NDA1 may include a first sub-non-display area SNDA1 and a second sub-non-display area SNDA2. The first sub-non-display area SNDA1 may be arranged farther away from the opening area OA than the second sub-non-display rea SNDA2 is. The second sub-non-display area SNDA2 may be between the first sub-non-display area SNDA1 and the opening area OA.

The second organic insulating layer 116 may cover a side surface of the first organic insulating layer 115, in the first sub-non-display area SNDA1. The second organic insulating layer 116 may expose the side surface of the first organic insulating layer 115, in the first sub-non-display area SNDA1.

The pixel-defining layer 118 may cover a side surface of the second organic insulating layer 116. The pixel-defining layer 118 may expose a side surface of the second organic insulating layer 116.

Signal lines, e.g., data lines DL described with reference to FIG. 5, may be arranged in the first sub-non-display area SNDA1. The data lines DL may be between the first insulating layer IL1 and the first organic insulating layer 115 and/or between the first organic insulating layer 115 and the second organic insulating layer 116. Given that the data lines DL are arranged on different layers, a width of the first non-display area NDA1 may be reduced. Scan lines that bypass the opening area OA, described above with reference to FIG. 5, may also be arranged in the first sub-non-display area SNDA1.

A dam DP may be provided by stacking a plurality of layers. The dam DP may protrude from an upper surface ILUS of the first insulating layer IL1. For example, the dam DP may protrude from an upper surface of the interlayer insulating layer 114. The dam DP may include an organic pattern layer 116A, a first upper organic pattern layer 118A, and a second upper organic pattern layer 119A. The organic pattern layer 116A may be arranged separately from the second insulating layer IL2. The organic pattern layer 116A may include a same material as the second insulating layer IL2. The organic pattern layer 116A may include a same material as the second organic insulating layer 116. The organic pattern layer 116A may include a same material as the first organic insulating layer 115. The organic pattern layer 116A may include a first organic pattern layer and a second organic pattern layer arranged on the first organic pattern layer. In this case, the first organic pattern layer may include a same material as the first organic insulating layer 115. The second organic pattern layer may include a same material as the second organic insulating layer 116.

The first upper organic pattern layer 118A may be arranged on the organic pattern layer 116A. The first upper organic pattern layer 118A may be arranged on an upper surface of the organic pattern layer 116A. The first upper organic pattern layer 118A may expose a side wall 116AW of the organic pattern layer 116A. The side wall 116AW of the organic pattern layer 116A refers to a side surface of the organic pattern layer 116A. The first upper organic pattern layer 118A may cover the upper surface and the side wall 116AW of the organic pattern layer 116A. The first upper organic pattern layer 118A may include a same material as the pixel-defining layer 118.

The second upper organic pattern layer 119A may be arranged on the first upper organic pattern layer 118A. The second upper organic pattern layer 119A may be arranged on an upper surface of the first upper organic pattern layer 118A. The second upper organic pattern layer 119A may expose a side wall of the first upper organic pattern layer 118A and the side wall 116AW of the organic pattern layer 116A. The side wall of the first upper organic pattern layer 118A refers to a side surface of the first upper organic pattern layer 118A. The second upper organic pattern layer 119A may cover the side wall of the first upper organic pattern layer 118A.

The first insulating layer IL1 may include a recess R indented in a depth/thickness direction of the first insulating layer IL1, in the second sub-non-display area SNDA2. The recess R may be indented in a depth/thickness direction of the substrate 100, on the first insulating layer IL1. The recess R may be provided in the interlayer insulating layer 114. The recess R may include a bottom surface, a first side wall RW1, and a second side wall RW2, which are connected to each other. The bottom surface is below the upper surface ILUS of the first insulating layer IL1. Each of the first side wall RW1 and the second side wall RW2 may connect the upper surface ILUS of the first insulating layer IL1 to the bottom surface of the recess R. The first side wall RW1 and the second side wall RW2 may be surfaces of the first insulating layer IL1 facing each other. The first side wall RW1 may be arranged closer to the display area DA than the second side wall RW2 is.

The recess R may be arranged closer to the opening area OA than the dam DP is. The recess R may be between the opening area OA and the dam DP. The recess R may be arranged closer to the opening area OA than the organic pattern layer 116A is. The recess R may be between the opening area OA and the organic pattern layer 116A.

The first insulating layer IL1 may include at least one recess R. For example, the first insulating layer IL1 may include one recess R. The first insulating layer IL1 may include a plurality of recesses R.

The recess R and the dam DP may be adjacent to each other. The first side wall RW1 of the recess R may be directly connected to the dam DP. The first side wall RW1 of the recess R and the dam DP may be consecutively arranged. The first side wall RW1 of the recess R may be in contact with (e.g., directly connected to) the side wall 116AW of the organic pattern layer 116A. The first side wall RW1 of the recess R and the side wall 116AW of the organic pattern layer 116A may be consecutively arranged. The first side wall RW1 of the recess R and the side wall 116AW of the organic pattern layer 116A may be oriented at a same angle or different angles relative to the substrate 100 in a cross-sectional view of the display panel 10.

The first insulating layer IL1 may include an intermediate recess MR similar to the recess R. The intermediate recess MR may be indented in the depth/thickness direction of the first insulating layer IL1. The intermediate recess MR may be provided in the interlayer insulating layer 114. The intermediate recess MR may be between the organic pattern layer 116A and the second insulating layer IL2.

The intermediate recess MR may include a bottom surface, a first intermediate side wall MRW1, and a second intermediate side wall MRW2, which are connected to each other. The bottom surface is arranged below the upper surface ILUS of the first insulating layer IL1. Each of the first intermediate side wall MRW1 and the second intermediate side wall MRW2 may connect the upper surface ILUS of the first insulating layer IL1 to the bottom surface of the intermediate recess MR. The first intermediate side wall MRW1 and the second intermediate side wall MRW2 may be surfaces of the first insulating layer IL1 facing each other. The second intermediate side wall MRW2 may be arranged closer to the display area DA than the first intermediate side wall MRW1 is.

The first intermediate side wall MRW1 may be in contact with (e.g., directly connected to) an inner side wall 116AW-1 of the organic pattern layer 116A. The inner side wall 116AW-1 of the organic pattern layer 116A is opposite the side wall 116AW of the organic pattern layer 116A, and may face the display area DA. The second intermediate side wall MRW2 may be directly connected to the side surface of the second organic insulating layer 116. The pixel-defining layer 118 may cover the second intermediate side wall MRW2.

The first functional layer 212a, the second functional layer 212c, the second electrode 213, and the capping layer 215 may extend from the display area DA to the first non-display area NDA1. The first functional layer 212a, the second functional layer 212c, the second electrode 213, and the capping layer 215 may cover the dam DP and may extend to the first side wall RW1 of the recess R. Portions of the first functional layer 212a, the second functional layer 212c, the second electrode 213, and the capping layer 215 may be arranged inside the recess R.

The first functional layer 212a, the second functional layer 212c, the second electrode 213, and the capping layer 215 may have edges that are positioned at the second side wall RW2 of the recess R. The first functional layer 212a, the second functional layer 212c, the second electrode 213, and the capping layer 215 may include the through hole TAH that exposes the upper surface ILUS of the first insulating layer IL1. At least one of the first functional layer 212a and the second functional layer 212c may include a first through hole TAH1 that exposes the upper surface ILUS of the first insulating layer IL1. The second electrode 213 may include a second through hole TAH2 that exposes the upper surface ILUS of the first insulating layer IL1. The capping layer 215 may include a third through hole TAH3 that exposes the upper surface ILUS of the first insulating layer IL1.

An area of the through hole TAH may be greater than an area of the opening area OA. An end/edge of the through hole TAH may be arranged at an end/edge of the recess R where the dam DP is not arranged. If at least one of the first functional layer 212a and the second functional layer 212c, which may include an organic material, is entirely formed over the first non-display area NDA1 and extends to the opening area OA, moisture may penetrate into the organic light-emitting diode OLED arranged in the display area DA through the first functional layer 212a and/or the second functional layer 212c, due to the nature of an organic material layer. According to embodiments, the first through hole TAH1 is formed at an edge of the recess R, and thus penetration of moisture or foreign matter into the organic light-emitting diode OLED may be prevented or reduced.

The encapsulation layer ENL may cover the organic light-emitting diode OLED. The encapsulation layer ENL may be arranged on the second electrode 213 and/or the capping layer 215. The encapsulation layer ENL may include at least one inorganic encapsulation layer and at least one organic encapsulation layer. FIG. 7A illustrates that the encapsulation layer ENL includes a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may extend from the display area DA to the first non-display area NDA1. The first inorganic encapsulation layer 310 and the second inorganic encapsulation layer 330 may be entirely and continuously arranged over the first non-display area NDA1. The first inorganic encapsulation layer 310 and the second inorganic encapsulation layer 330 may extend to the dam DP and may contact each other on an upper surface of the dam DP. The first inorganic encapsulation layer 310 and the second inorganic encapsulation layer 330 may cover the first side wall RW1 and the second side wall RW2 of the recess R, and may extend from the recess R to the opening area OA. The first inorganic encapsulation layer 310 and the second inorganic encapsulation layer 330 may overlap the through hole TAH. The first inorganic encapsulation layer 310 and the second inorganic encapsulation layer 330 may overlap the first through hole TAH1, the second through hole TAH2, and the third through hole TAH3. The first inorganic encapsulation layer 310 may directly contact a portion of the upper surface ILUS of the first insulating layer IL1 that is adjacent to the opening area OA. The first inorganic encapsulation layer 310 may contact the interlayer insulating layer 114. Because no organic material layer is arranged in an area between the recess R and the opening area OA, penetration of moisture into the organic light-emitting diode OLED arranged in the display area DA may be prevented or reduced.

The organic encapsulation layer 320 may be formed by applying and then curing a monomer. A flow of the monomer may be controlled by the dam DP. An end portion of the organic encapsulation layer 320 may be located on one side of the dam DP.

Figure 8A:
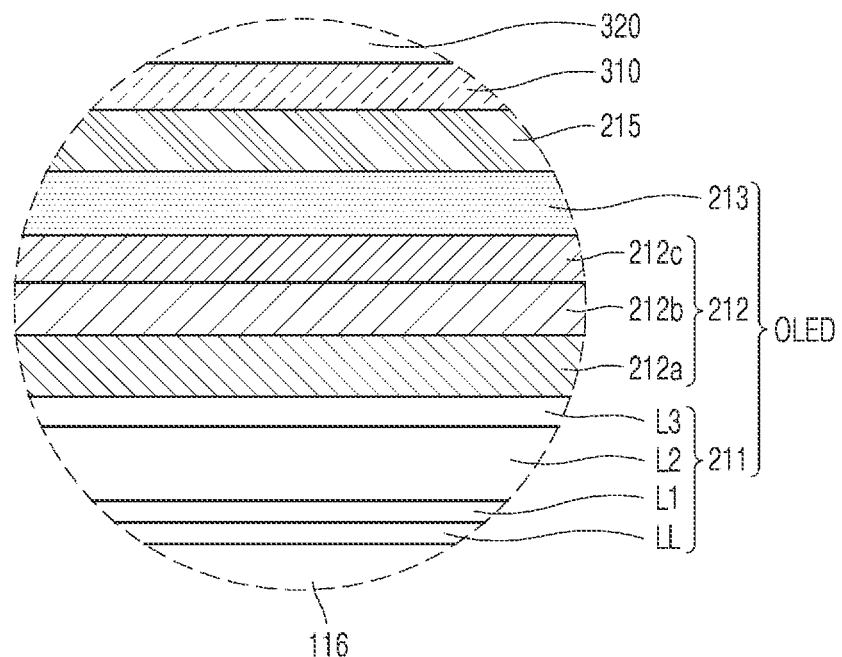
FIG. 8A is a schematic cross-sectional view illustrating an organic light-emitting diode according to an embodiment.
Figure 8B:
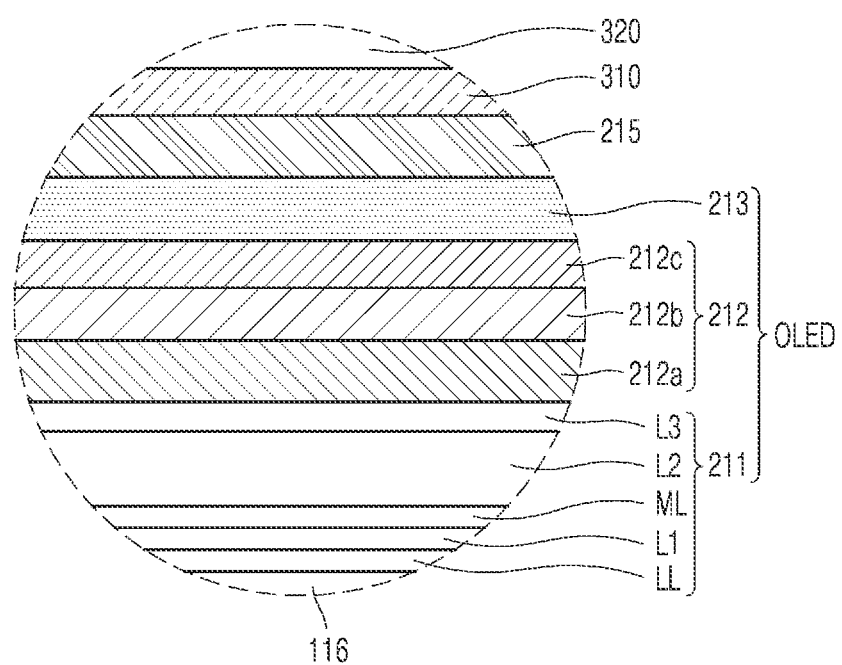
FIG. 8B is a schematic cross-sectional view illustrating an organic light-emitting diode according to an embodiment.

Each of FIGS. 8A and 8B illustrates a cross-sectional view of an organic light-emitting diode OLED according to an embodiment. In FIGS. 8A and 8B, the same reference numerals as those in FIGS. 7A and 7B may refer to the same members or analogous members.

Referring to FIG. 8A, the organic light-emitting diode OLED may include the first electrode 211, the intermediate layer 212, and the second electrode 213. The intermediate layer 212 may include the emission layer 212b. The first functional layer 212a may be between the first electrode 211 and the emission layer 212b. The second functional layer 212c may be between the emission layer 212b and the second electrode 213.

The first electrode 211 may include the first layer L1, the second layer L2, and the third layer L3. The first layer L1 may include Ti. The first electrode 211 may further include a lower layer LL under the first layer L1. The lower layer LL may include TiN. The lower layer LL may prevent or reduce oxidation of the first layer L1. Without the lower layer LL, moisture or oxygen may be supplied to the first layer L1 through the second organic insulating layer 116. Ti of the first layer L1 may be oxidized into a titanium oxide ($TiO_2$). Because the lower layer LL includes TiN, oxidation of the first layer L1 may be prevented or reduced.

Referring to FIG. 8B, the first electrode 211 may further include an intermediate layer ML between the first layer L1 and the second layer L2. The intermediate layer ML may include a same material as the third layer L3. The intermediate layer ML may include a conductive oxide such as ITO, IZO, ZnO, $In_2O_3$, IGO, or AZO. The lower layer LL may be optional. The first electrode 211 may include the first layer L1, the intermediate layer ML, the second layer L2, and the third layer L3.

Figure 9:
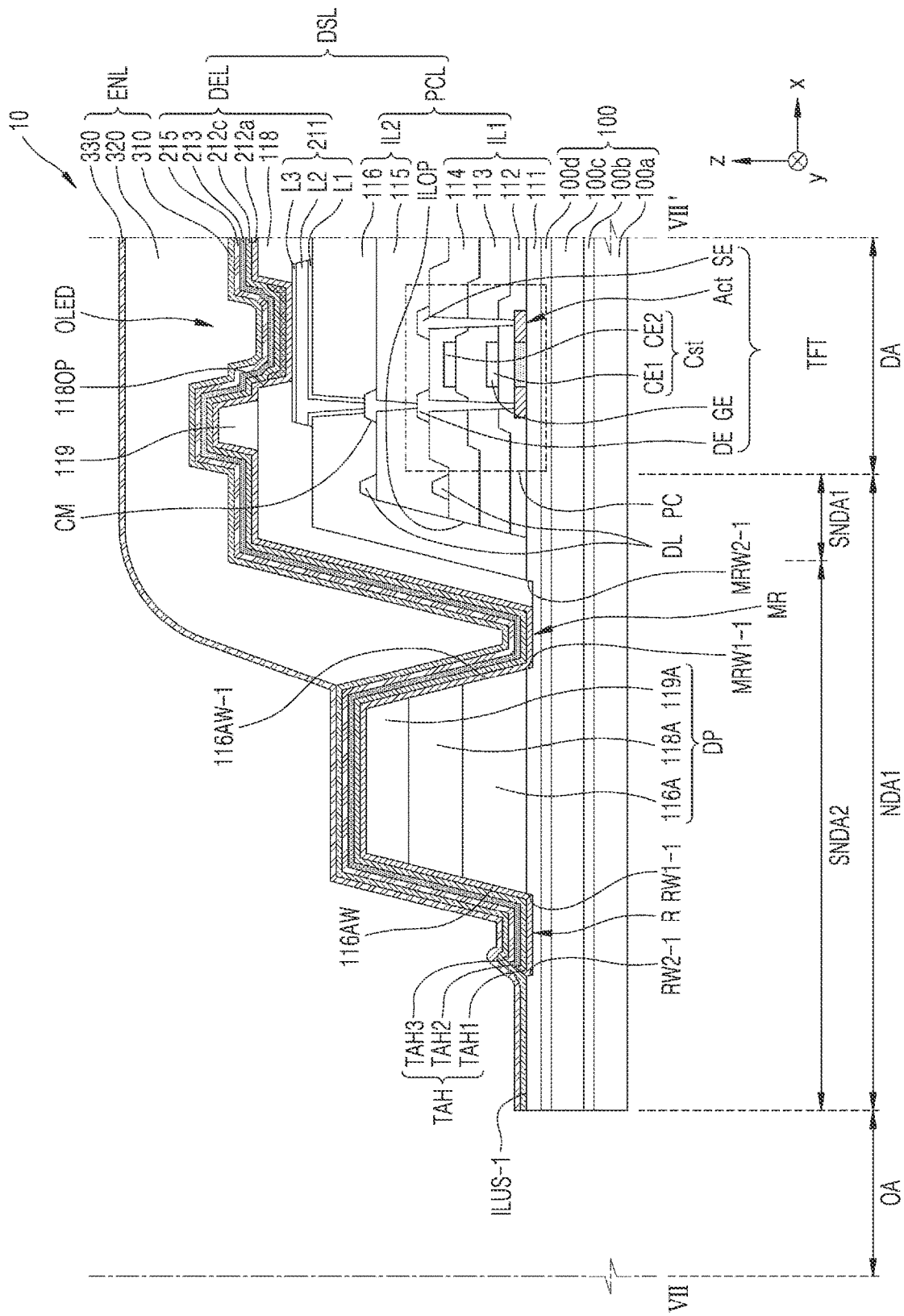
FIG. 9 is a schematic cross-sectional view of a display panel taken along a line VII-VII' of FIG. 6 according to an embodiment.

FIG. 9 is a schematic cross-sectional view of a display panel 10 taken along a line VII-VII' of FIG. 6 according to an embodiment. In FIG. 9, the same reference numerals as those in FIG. 7A may refer to the same members or analogous members.

Referring to FIG. 9, the display panel 10 may include the substrate 100, the pixel circuit layer PCL, the display element layer DEL, and the encapsulation layer ENL. The pixel circuit layer PCL may include the pixel circuit PC, the first insulating layer IL1, and the second insulating layer IL2. The first insulating layer IL1 may include the buffer layer 111, the first gate insulating layer 112, the second gate insulating layer 113, and the interlayer insulating layer 114.

The buffer layer 111 may be entirely arranged over the display area DA and the first non-display area NDA1. The first gate insulating layer 112, the second gate insulating layer 113, and the interlayer insulating layer 114 may include an inorganic insulating layer opening ILOP in the first non-display area NDA1. The buffer layer 111 may be exposed in the first non-display area NDA1 by the inorganic insulating layer opening ILOP.

The dam DP may be provided by stacking a plurality of layers. The dam DP may protrude from an upper surface ILUS-1 of the first insulating layer IL1. For example, the dam DP may protrude from an upper surface of the buffer layer 111. The dam DP may be arranged on the buffer layer 111 that is exposed by the inorganic insulating layer opening ILOP. The dam DP may include the organic pattern layer 116A, the first upper organic pattern layer 118A, and the second upper organic pattern layer 119A, which are arranged on the buffer layer 111.

The first insulating layer IL1 may include the recess R indented in the depth direction of the first insulating layer IL1, in the second sub-non-display area SNDA2. The recess R may be provided in the buffer layer 111. The recess R may be defined by a bottom surface, a first side wall RW1-1, and a second side wall RW2-1. The bottom surface may be a surface located below the upper surface ILUS-1 of the first insulating layer IL1. Each of the first side wall RW1-1 and the second side wall RW2-1 may connect the bottom surface of the recess R to the upper surface ILUS-1 of the first insulating layer IL1. The first side wall RW1-1 and the second side wall RW2-1 may be surfaces of the first insulating layer IL1 facing each other. The first side wall RW1-1 may be arranged closer to the display area DA than the second side wall RW2-1 is.

The first insulating layer IL1 may include the intermediate recess MR similar to the recess R. The intermediate recess MR may be indented in the depth direction of the first insulating layer IL1. The intermediate recess MR may be provided in the buffer layer 111.

The intermediate recess MR may include a bottom surface, a first intermediate side wall MRW1-1, and a second intermediate side wall MRW2-1, which are connected to each other. The bottom surface is arranged below the upper surface ILUS-1 of the first insulating layer IL1. Each of the first intermediate side wall MRW1-1 and the second intermediate side wall MRW2-1 may connect the upper surface ILUS-1 of the first insulating layer IL1 to the bottom surface of the intermediate recess MR. The first intermediate side wall MRW1-1 and the second intermediate side wall MRW2-1 may be surfaces of the first insulating layer IL1 facing each other. The second intermediate side wall MRW2-1 may be arranged closer to the display area DA than the first intermediate side wall MRW1-1 is.

Figure 10:
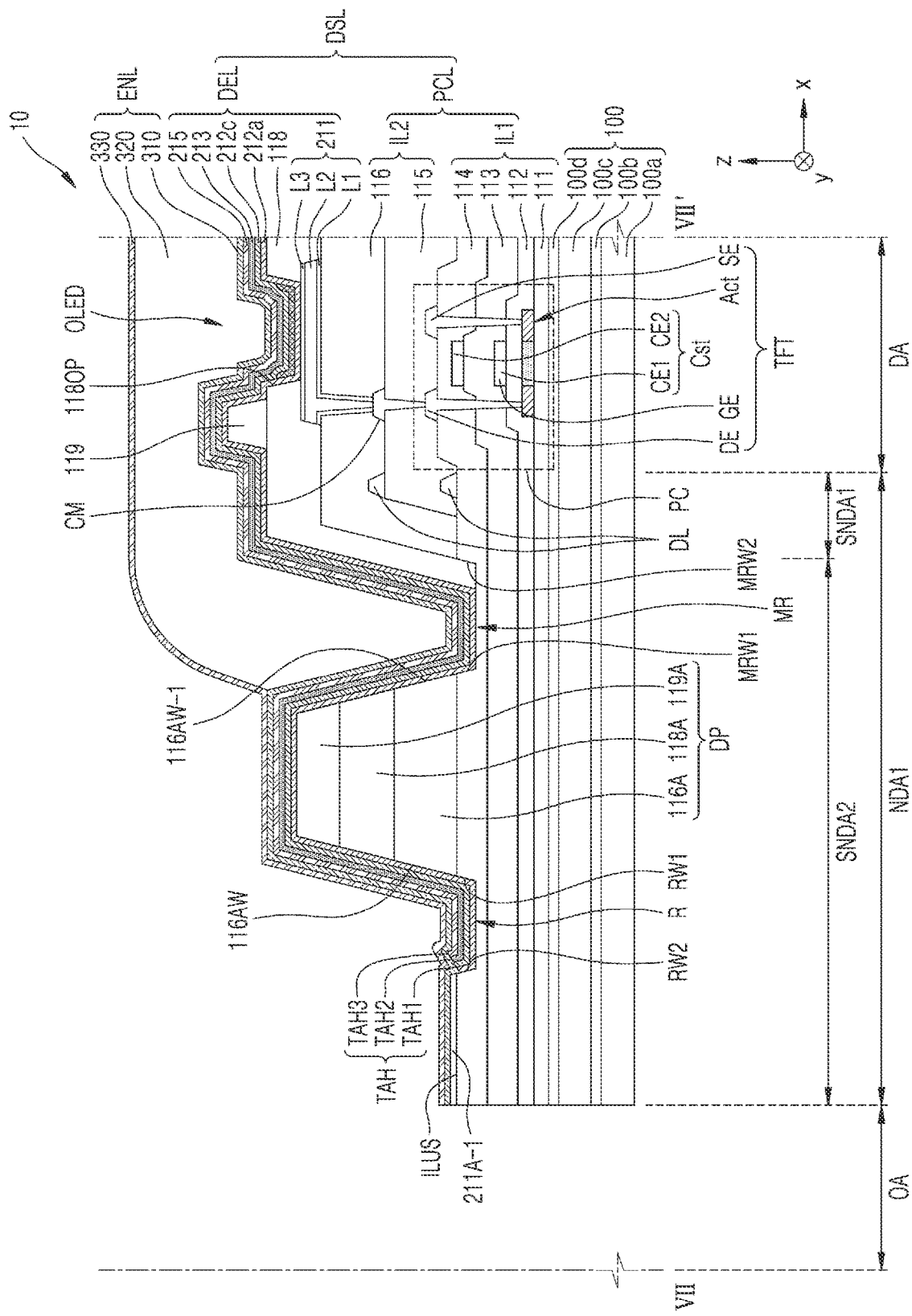
FIG. 10 is a schematic cross-sectional view of a display panel taken along a line VII-VII' of FIG. 6 according to an embodiment.

FIG. 10 is a schematic cross-sectional view of a display panel 10 taken along a line VII-VII' of FIG. 6 according to an embodiment. In FIG. 10, the same reference numerals as those in FIG. 7A refer to the same members or analogous members.

Referring to FIG. 10, the display panel 10 may include the substrate 100, the display layer DSL, and the encapsulation layer ENL. The display layer DSL may include the pixel circuit layer PCL and the display element layer DEL. The pixel circuit layer PCL may include the pixel circuit PC, the first insulating layer IL1, and the second insulating layer IL2.

In the first non-display area NDA1, an intermediate pattern layer 211A-1 may be between the first insulating layer IL1 and the encapsulation layer ENL. The intermediate pattern layer 211A-1 may be between the first insulating layer IL1 and the first inorganic encapsulation layer 310. The intermediate pattern layer 211A-1 may directly contact the first inorganic encapsulation layer 310. The intermediate pattern layer 211A-1 may be arranged on a portion of the upper surface ILUS of the first insulating layer IL1 between the opening area OA and the recess R. A side surface of the intermediate pattern layer 211A-1 may directly contact the second side wall RW2 of the recess R.

The intermediate pattern layer 211A-1 may be exposed by the through hole TAH. At least one of the first functional layer 212a and the second functional layer 212c may include a first through hole TAH1 that exposes the intermediate pattern layer 211A-1. The second electrode 213 may include a second through hole TAH2 that exposes the intermediate pattern layer 211A-1. The capping layer 215 may include a third through hole TAH3 that exposes the intermediate pattern layer 211A-1.

The intermediate pattern layer 211A-1 may include the same material as the first layer L1 of the first electrode 211. The intermediate pattern layer 211A-1 may include a-Si to which a dopant is added. The dopant may be/include at least one of B, P, N, Ni, Co, and F. The intermediate pattern layer 211A-1 may be formed simultaneously when the first layer L1 of the first electrode 211 is formed.

When the display panel 10 is manufactured, portions of the first functional layer 212a, the second functional layer 212c, the second electrode 213, and the capping layer 215 that are formed on the intermediate pattern layer 211A-1 may be removed using a laser lift-off method. Accordingly, the through hole TAH that exposes the intermediate pattern layer 211A-1 may be formed, and a portion of the first inorganic encapsulation layer 310 arranged in the through hole TAH and the intermediate pattern layer 211A-1 may prevent or reduce penetration of moisture or foreign matter into the organic light-emitting diode OLED.

Figure 11:
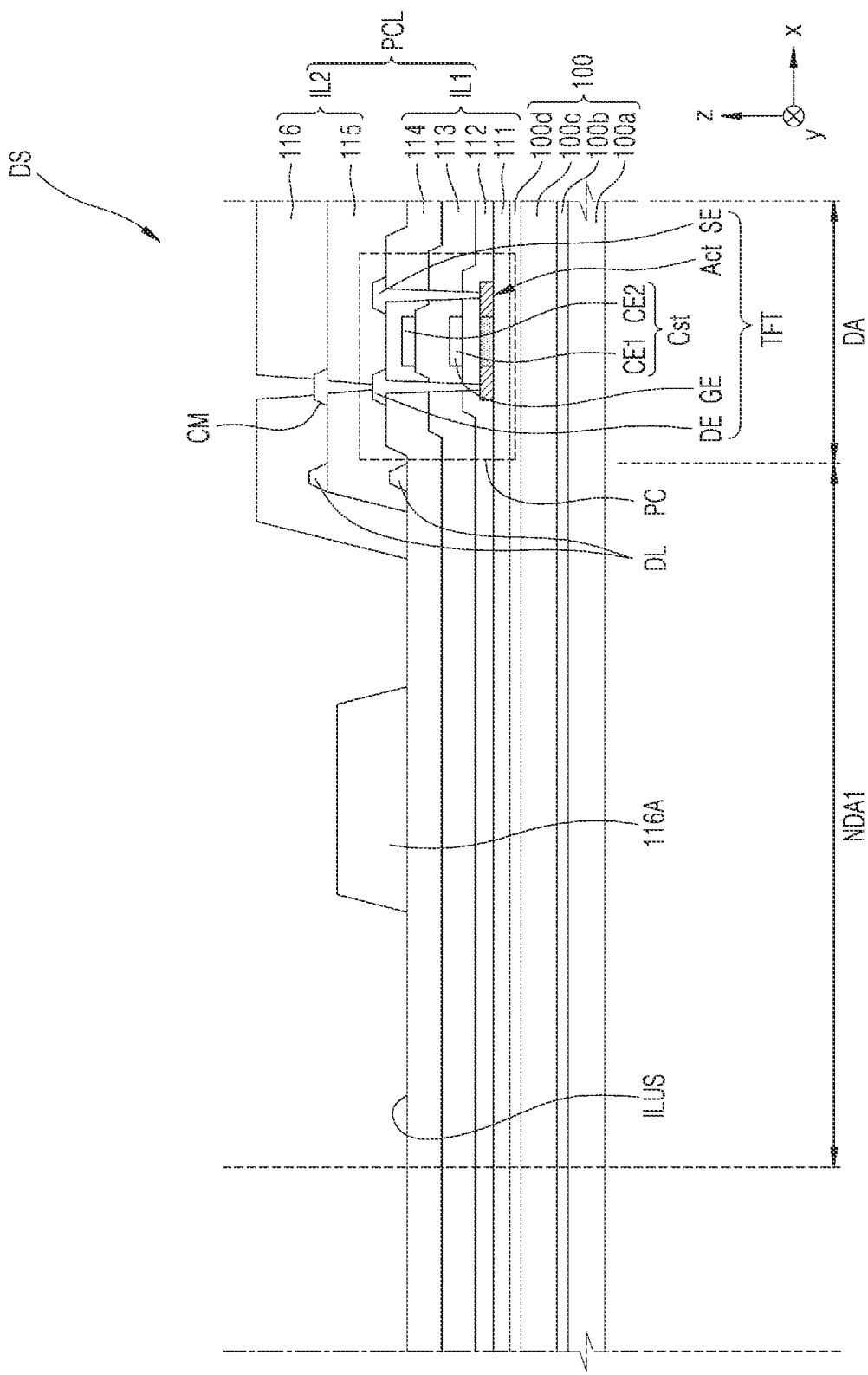
FIG. 11 and FIG. 12 are cross-sectional views of structures formed in a method of manufacturing a display device according to one or more embodiments.
Figure 12:
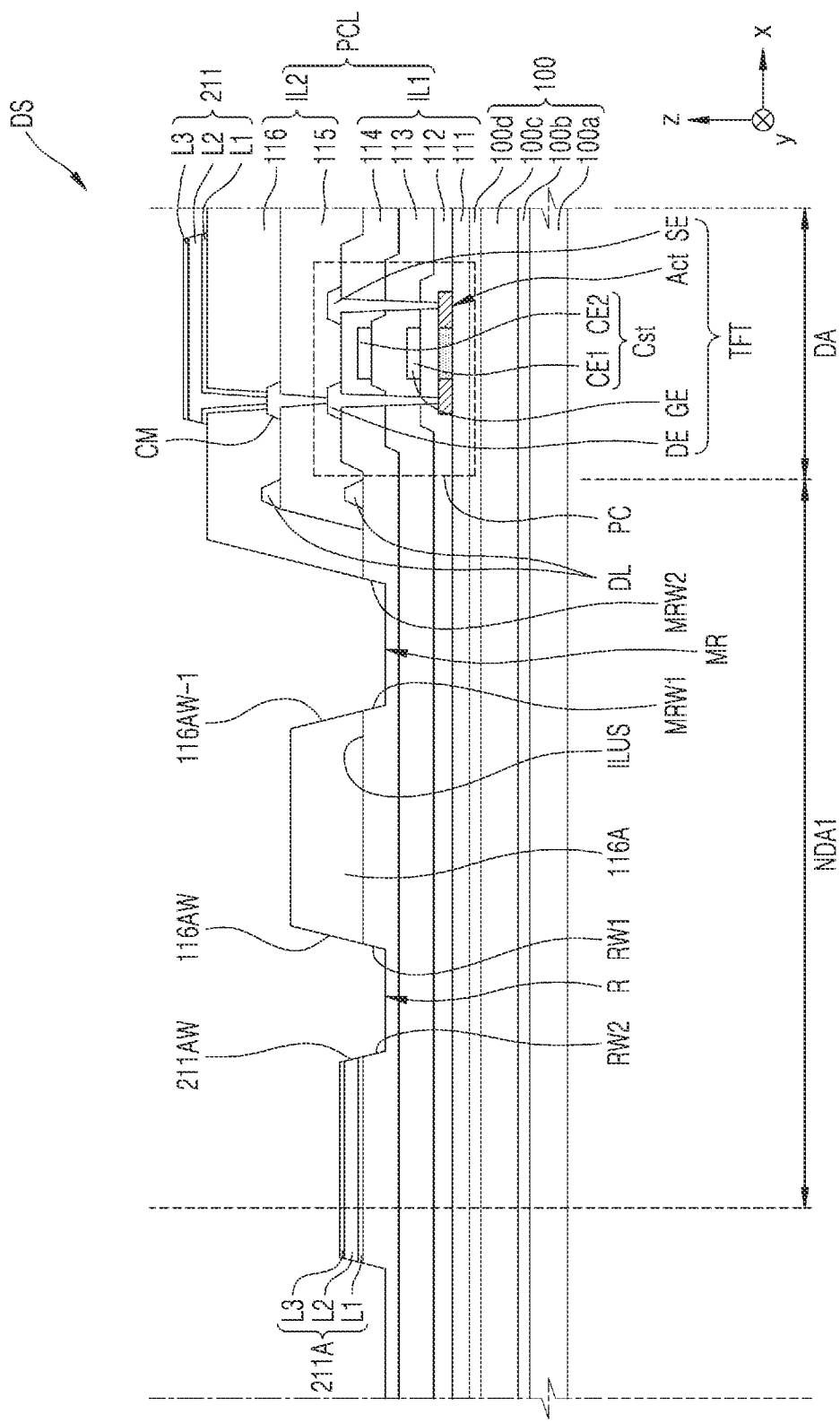

FIGS. 11 and 12 are cross-sectional views of structures formed in a method of manufacturing a display device according to one or more embodiments. FIGS. 13A to 13E are cross-sectional views of structures formed in a method of manufacturing a sacrificial pattern layer 211A according to one or more embodiments. FIGS. 14, 15, 16A, 16B, 17, and 18 are cross-sectional views of structures formed in a method of manufacturing a display device according to one or more embodiments.

Referring to FIG. 11, a display substrate DS may be prepared. The display substrate DS may include a substrate 100 and a pixel circuit layer PCL. The pixel circuit layer PCL may include a data line DL, a pixel circuit PC, a first insulating layer IL1, and a second insulating layer IL2. The first insulating layer IL1 may include a buffer layer 111, a first gate insulating layer 112, a second gate insulating layer 113, and an interlayer insulating layer 114. The second insulating layer IL2 may include a first organic insulating layer 115 and a second organic insulating layer 116.

The substrate 100 may include a display area DA and a first non-display area NDA1. The pixel circuit PC may be arranged in the display area DA. The organic pattern layer 116A may be arranged on an upper surface ILUS of the first insulating layer IL1.

Referring to FIG. 12, a first electrode 211 overlapping the display area DA may be formed above the first insulating layer IL1. The sacrificial pattern layer 211A overlapping the first non-display area NDA1 may be formed on the first insulating layer IL1 simultaneously with the first electrode 211. The sacrificial pattern layer 211A may be formed without an additional mask process.

The recess R may be formed in a depth/thickness direction of the first insulating layer IL1. The recess R may be between the sacrificial pattern layer 211A and the organic pattern layer 116A.

Figure 13A:
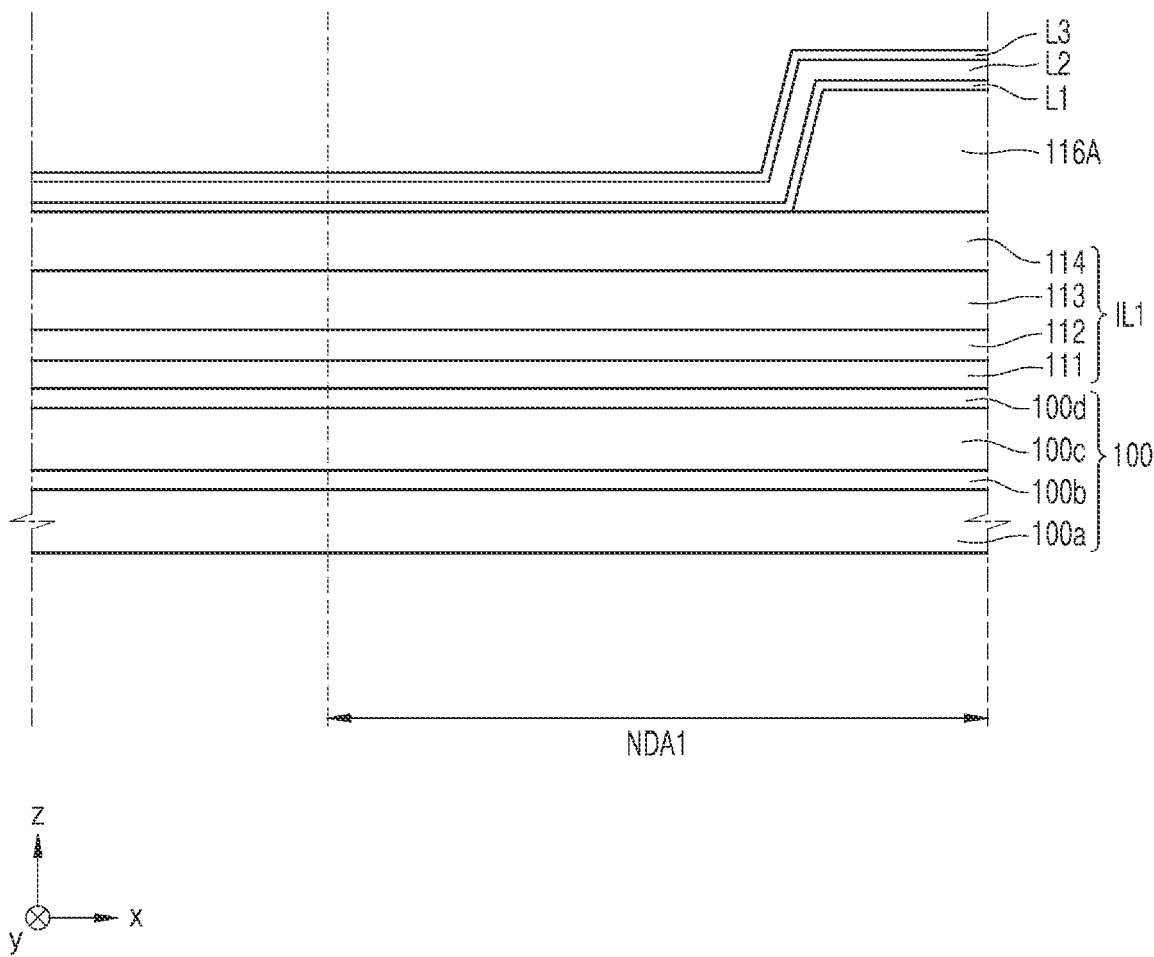
FIG. 13A, FIG. 13B, FIG. 13C, FIG. 13D, and FIG. 13E are cross-sectional views of structures formed in a method of manufacturing a sacrificial pattern layer according to one or more embodiments.

Referring to FIG. 13A, a first layer L1, a second layer L2, and a third layer L3 may be sequentially formed in the first non-display area NDA1. The first layer L1, the second layer L2, and the third layer L3 may be formed entirely and continuously in the first non-display area NDA1 and a display area.

The first layer L1 may include Ti. The first layer L1 may include TiN. The first layer L1 may include Mo. The first layer L1 may include a-Si to which a dopant is added. The dopant may be/include at least one of B, P, N, Ni, Co, and F. The second layer L2 may include a reflective layer including Ag, Mg, Al, Pt, Pd, Au, Ni, Nd, Ir, Cr, or a compound thereof. The third layer L3 may include a conductive oxide such as ITO, IZO, ZnO, In$_2$O$_3$, IGO, or AZO.

The lower layer LL (see FIG. 8A) including TiN may be further formed under the first layer L1. The intermediate layer ML (see FIG. 8B) including a conductive oxide may be further formed between the first layer L1 and the second layer L2.

Figure 13B:
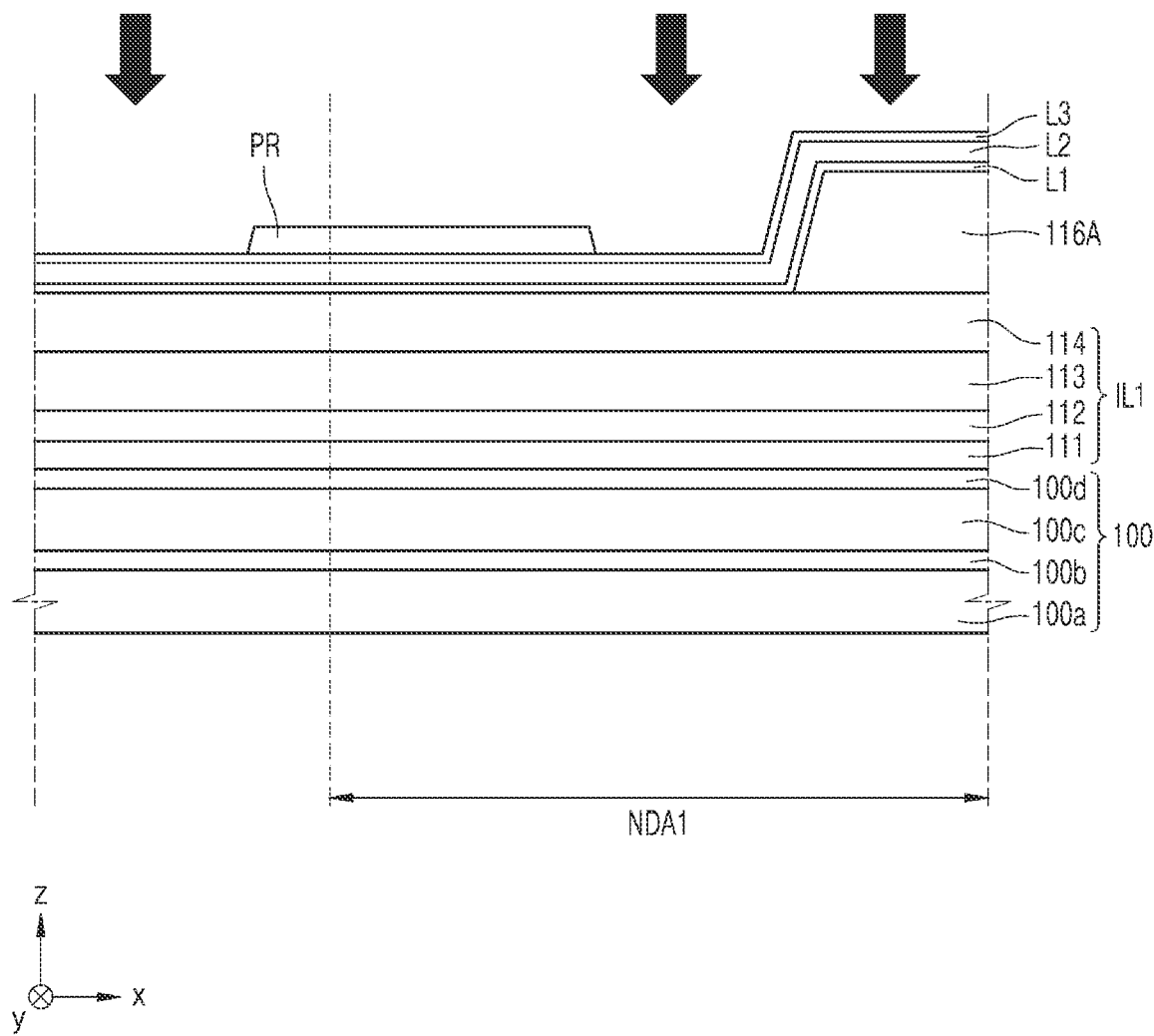
Figure 13C:
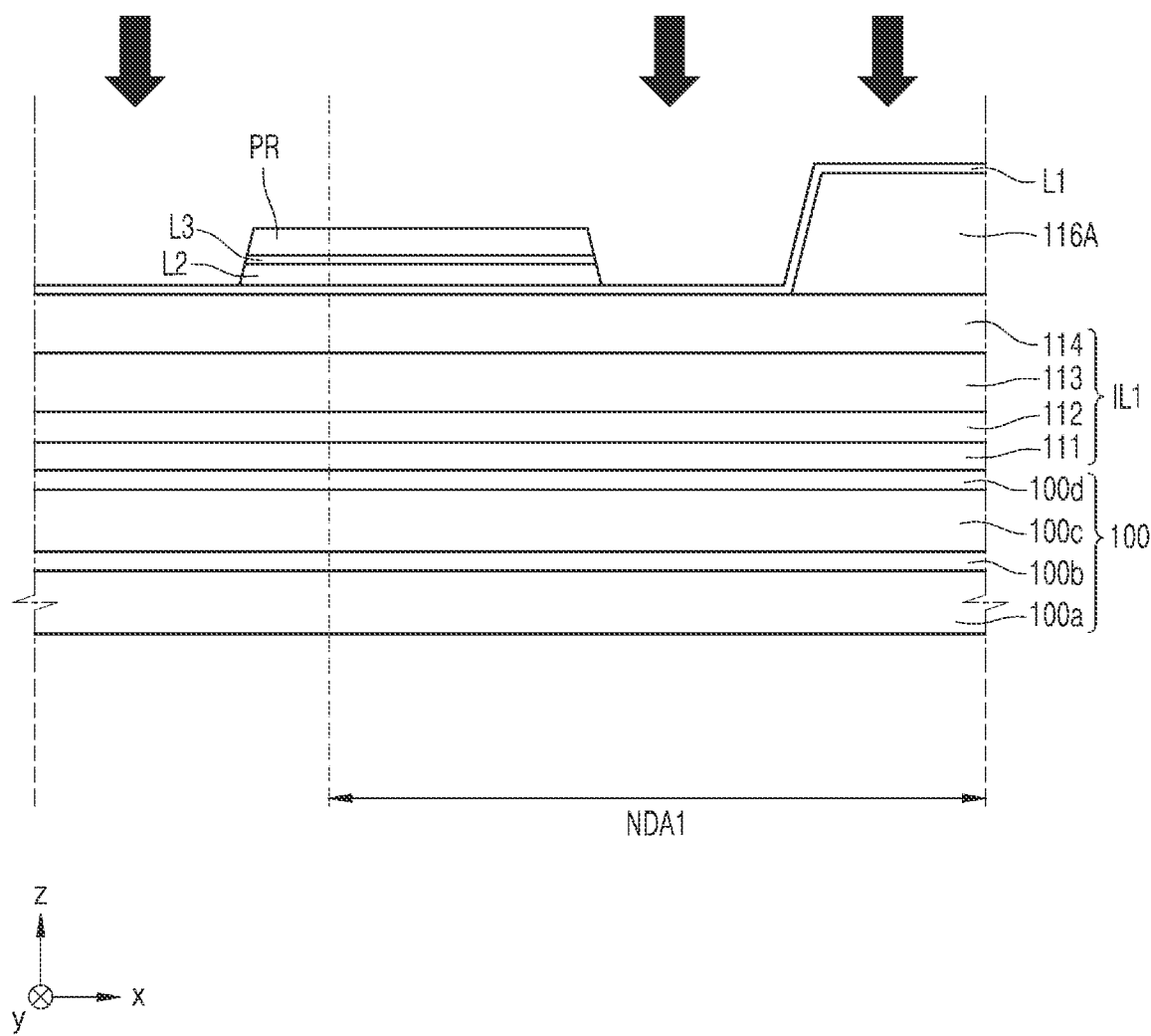

Referring to FIGS. 13B and 13C, a photoresist pattern PR may be formed on the third layer L3. First, a photoresist layer may be formed above/on the third layer L3. The photoresist layer may be of a positive type or a negative type. An exposed area of a positive-type photoresist layer is etched in a subsequent development process, whereas an unexposed area of a negative-type photoresist layer is etched.

The photoresist layer may be formed by applying a photoresist solution (not shown) to the third layer L3 through as spin-coating, slit-coating, spraying, or quenching.

Before the photoresist layer is applied to an upper surface of the third layer L3, a process of polishing the upper surface of the third layer L3 may be performed.

Next, the photoresist layer may be exposed. At least a portion of the photoresist layer may be exposed. For example, when a photomask is used, an area of the photoresist layer overlapping an opening of the photomask may be exposed.

Subsequently, the portion of the photoresist layer may be removed through a development process. Accordingly, the photoresist pattern PR may be formed on the third layer L3.

Subsequently, the second layer L2 and the third layer L3 may be etched using the photoresist pattern PR as a mask. Accordingly, the second layer L2 and the third layer L3 may be etched except for portions of the second layer L2 and the third layer L3 overlapping the photoresist pattern PR. The second layer L2 and the third layer L3 may be wet-etched.

Figure 13D:
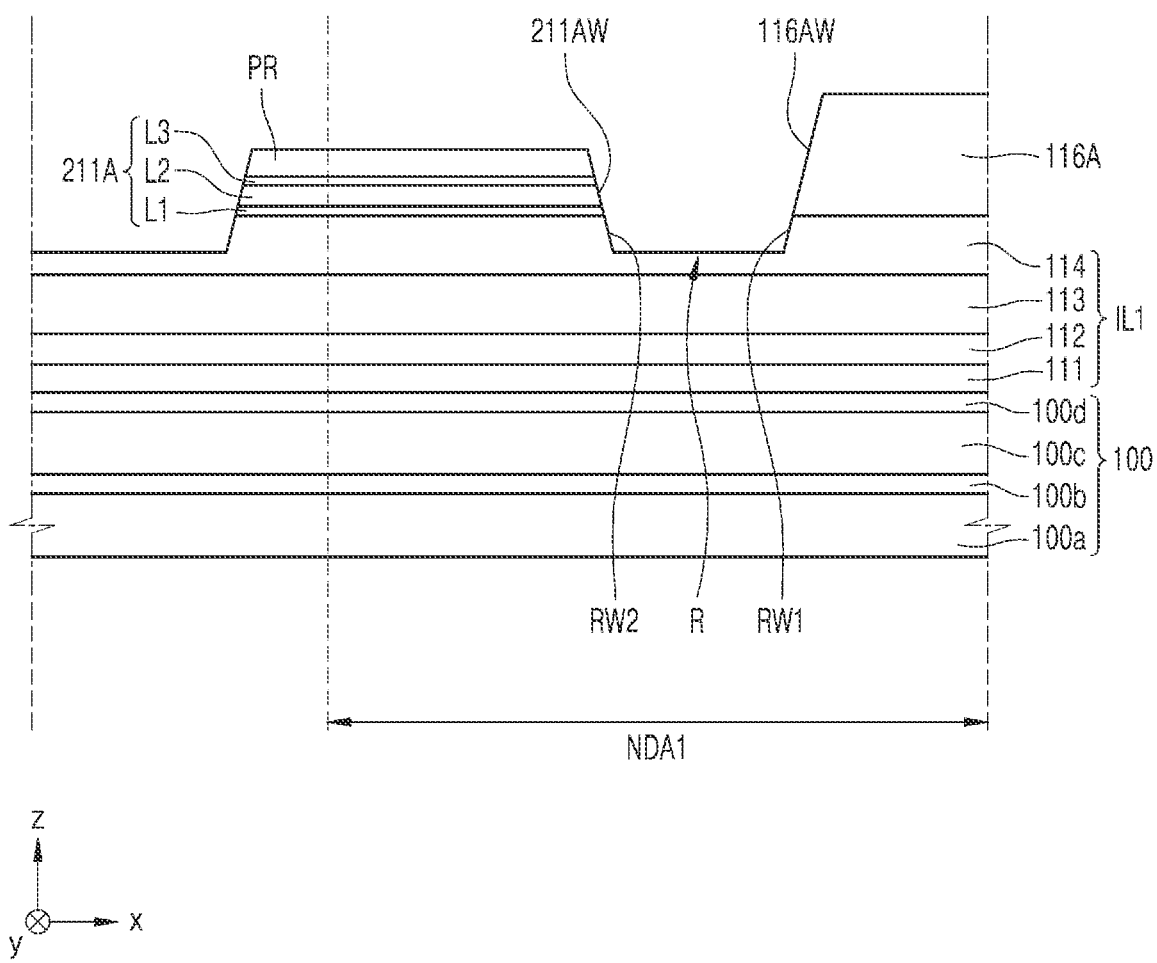

Referring to FIG. 13D, the first layer L1 may be etched using the photoresist pattern PR as a mask. The first layer L1 may be wet-etched. When the first layer L1 includes Ti, the first layer L1 may be wet-etched using ammonium chloride (NH$_4$F) and hydrogen chloride (HF).

The first layer L1 may be dry-etched. When the first layer L1 includes Ti, the first layer L1 may be dry-etched using carbon tetrachloride (CF$_4$) and oxygen (O$_2$). Accordingly, the sacrificial pattern layer 211A overlapping the first non-display area NDA1 may be formed.

When the first layer L1 of the sacrificial pattern layer 211A is etched, the recess R may be formed by over-etching the first layer L1. The recess R may be formed around the sacrificial pattern layer 211A. The recess R may be formed by removing a portion of the first insulating layer IL1.

The recess R may include the bottom surface, the first side wall RW1, and the second side wall RW2. The first side wall RW1 of the recess R may be in contact with (e.g., directly connected to) the side wall 116AW of the organic pattern layer 116A. The second side wall RW2 of the recess R may be in contact with (e.g., directly connected to) a side wall 211AW of the sacrificial pattern layer 211A.

Figure 13E:
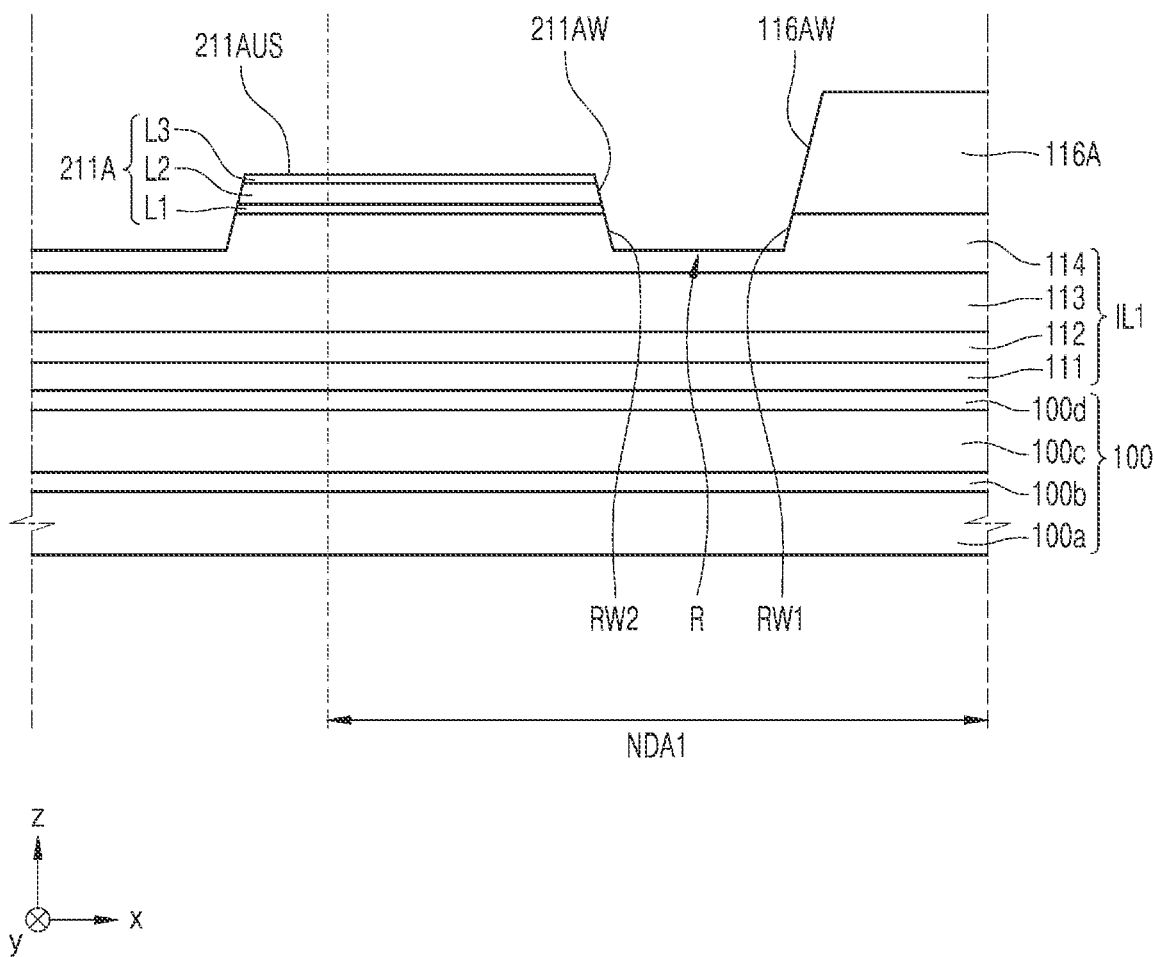

Subsequently, referring to FIGS. 13D and 13E, the photoresist pattern PR may be removed through a development process. Accordingly, an upper surface 211AUS of the sacrificial pattern layer 211A may be exposed. A first electrode may be formed in a method similar to a method of forming the sacrificial pattern layer 211A, and the first electrode and the sacrificial pattern layer 211A may be simultaneously formed.

Similar to the recess R, the intermediate recess MR may be formed by over-etching the first insulating layer IL1. The intermediate recess MR may be between the organic pattern layer 116A and the second organic insulating layer 116.

The intermediate recess MR may include the bottom surface, the first intermediate side wall MRW1, and the second intermediate side wall MRW2, which are connected to each other. The first intermediate side wall MRW1 may be directly connected to the inner side wall 116AW-1 of the organic pattern layer 116A. The second intermediate side wall MRW2 may be directly connected to the side surface of the second organic insulating layer 116.

Figure 14:
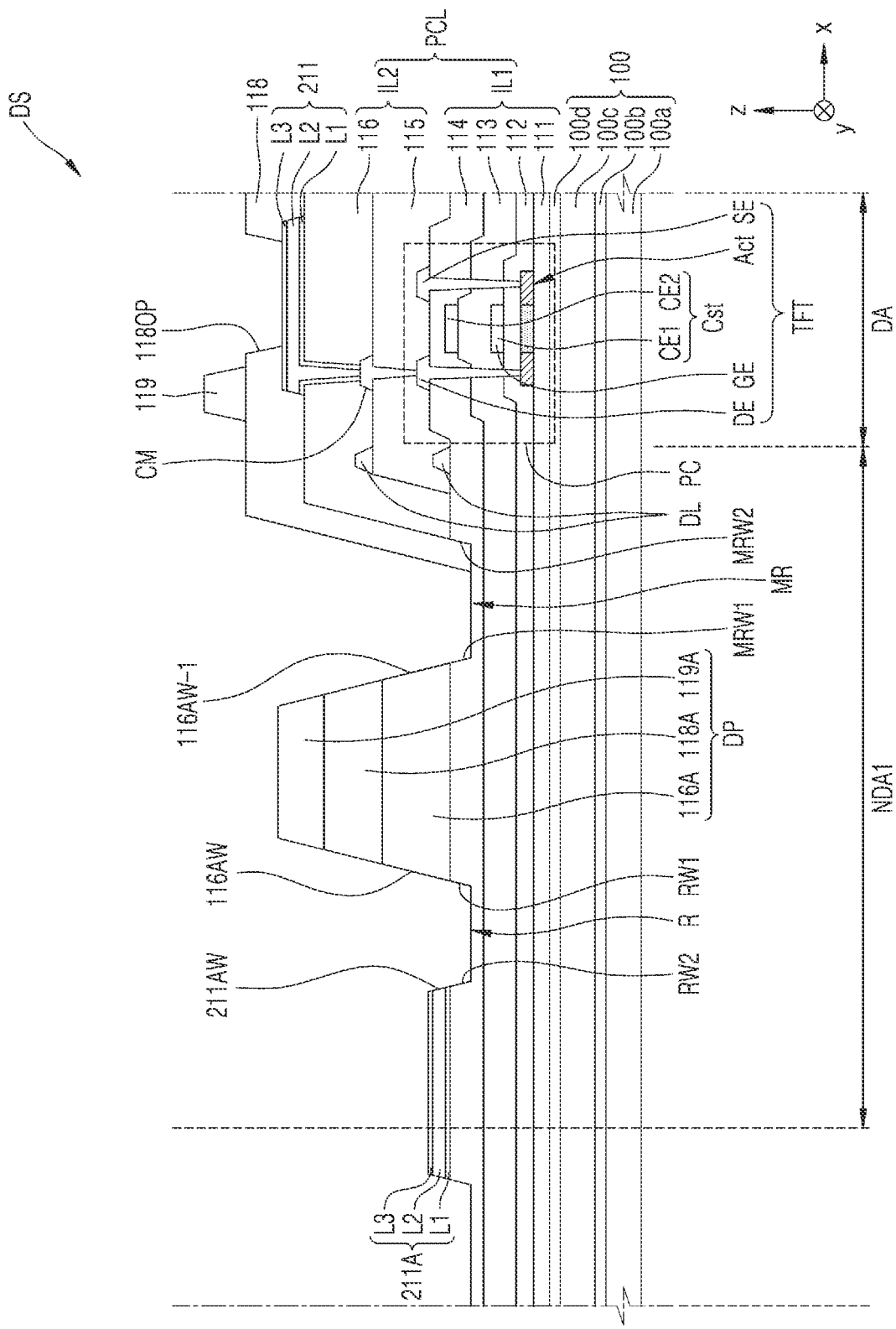
FIG. 14, FIG. 15, FIG. 16A, FIG. 16B, FIG. 17, and FIG. 18 are cross-sectional views of structures formed in a method of manufacturing a display device according to one or more embodiments.

Referring to FIG. 14, the pixel-defining layer 118 including the opening 1180P that exposes a central portion of the first electrode 211 may be formed on the first electrode 211, and the spacer 119 may be formed on the pixel-defining layer 118. The pixel-defining layer 118 may cover the second intermediate side wall MRW2.

The first upper organic pattern layer 118A and the second upper organic pattern layer 119A may be formed on the organic pattern layer 116A. The first upper organic pattern layer 118A may be formed simultaneously with the pixel-defining layer 118. When the first upper organic pattern layer 118A and the pixel-defining layer 118 include an organic material, the first upper organic pattern layer 118A and the pixel-defining layer 118 may be formed by applying the organic material to a front surface of the substrate 100 and performing a photocuring process and a patterning process on the organic material. The first upper organic pattern layer 118A and the pixel-defining layer 118 may include the same material. The second upper organic pattern layer 119A may be formed simultaneously with the spacer 119. When the second upper organic pattern layer 119A and the spacer 119 include an organic material, the second upper organic pattern layer 119A and the spacer 119 may be formed by applying the organic material to the front surface of the substrate 100 and performing a photocuring process and a patterning process on the organic material. The second upper organic pattern layer 119A and the spacer 119 may include the same material.

Figure 15:
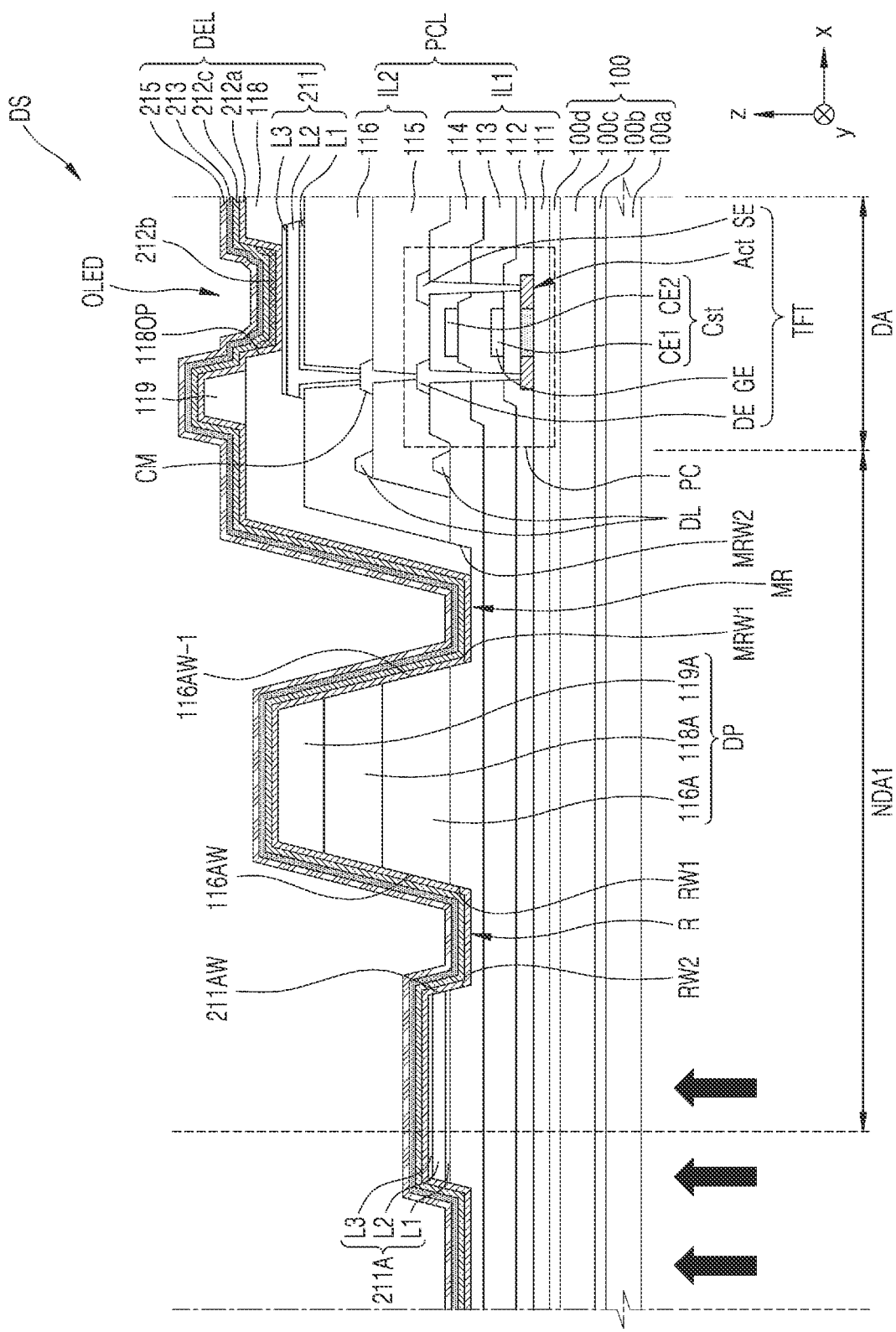

Referring to FIG. 15, at least one of the first functional layer 212a and the second functional layer 212c, and the second electrode 213 may be formed. The first functional layer 212a, the emission layer 212b, the second functional layer 212c, the second electrode 213, and the capping layer 215 may be sequentially formed on the front/upper surface of the substrate 100. The emission layer 212b may overlap the first electrode 211. The first functional layer 212a, the second functional layer 212c, the second electrode 213, and the capping layer 215 may be sequentially stacked on the sacrificial pattern layer 211A.

Subsequently, portions of at least one of the first functional layer 212a and the second functional layer 212c, and the second electrode 213 that are arranged on the sacrificial pattern layer 211A may be removed (i.e., at least one of the first functional layer 212a and the second functional layer 212c, and the second electrode 213, which are arranged on the sacrificial pattern layer 211A, may be removed). In an embodiment, laser light may be irradiated onto the sacrificial pattern layer 211A. The laser light may be irradiated onto the sacrificial pattern layer 211A from a lower surface of the substrate 100. The laser light may travel from the lower surface of the substrate 100 in a thickness direction of the substrate 100 and be irradiated onto a lower surface of the sacrificial pattern layer 211A. The laser light may have an infrared wavelength. When the laser light is infrared light, the transmittances of the substrate 100 and the first insulating layer IL1 are in a range of about 80% to about 90% or greater than 90%, and thus the laser light may efficiently reach the sacrificial pattern layer 211A.

The sacrificial pattern layer 211A includes an opaque metal and thus absorbs the laser light. At least a portion of the sacrificial pattern layer 211A may be thermally expanded and lifted off from the first insulating layer IL1.

Figure 16A:
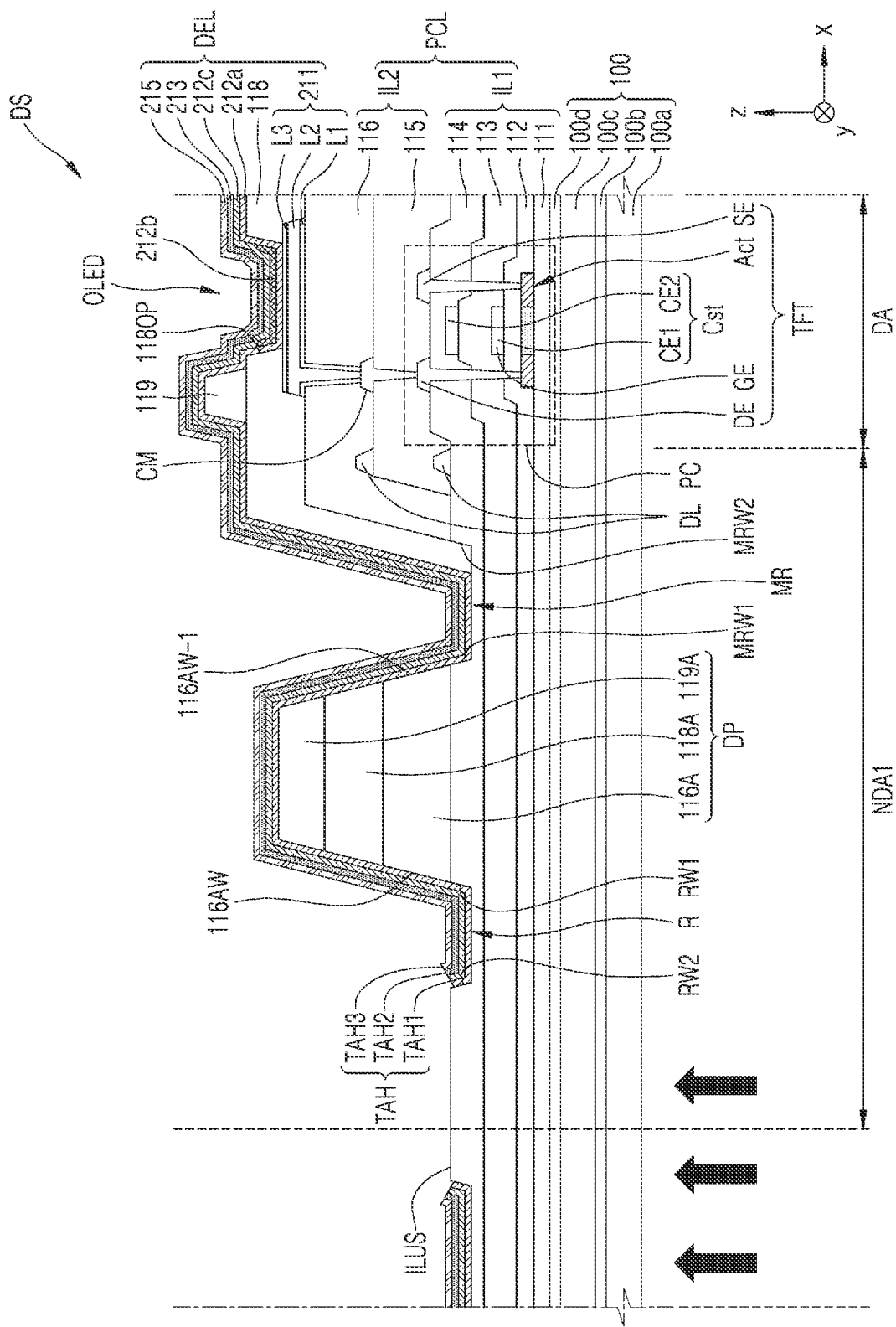

Referring to FIGS. 15 and 16A, when the first layer L1 of the sacrificial pattern layer 211A includes Ti, the sacrificial pattern layer 211A may be lifted off from the first insulating layer IL1. Portions of the first layer L1, the second layer L2, and the third layer L3 may be lifted off from the first insulating layer IL1. Portions of the first functional layer 212a, the second functional layer 212c, the second electrode 213, and the capping layer 215 that are arranged on the third layer L3 may be lifted off along with the sacrificial pattern layer 211A. Accordingly, the first through hole TAH1 that exposes a portion of the upper surface ILUS of the first insulating layer IL1 may be formed in the first functional layer 212a and the second functional layer 212c. The second through hole TAH2 that exposes a portion of the upper surface ILUS of the first insulating layer IL1 may be formed in the second electrode 213. The third through hole TAH3 that exposes a portion of the upper surface ILUS of the first insulating layer IL1 may be formed in the capping layer 215.

Figure 16B:
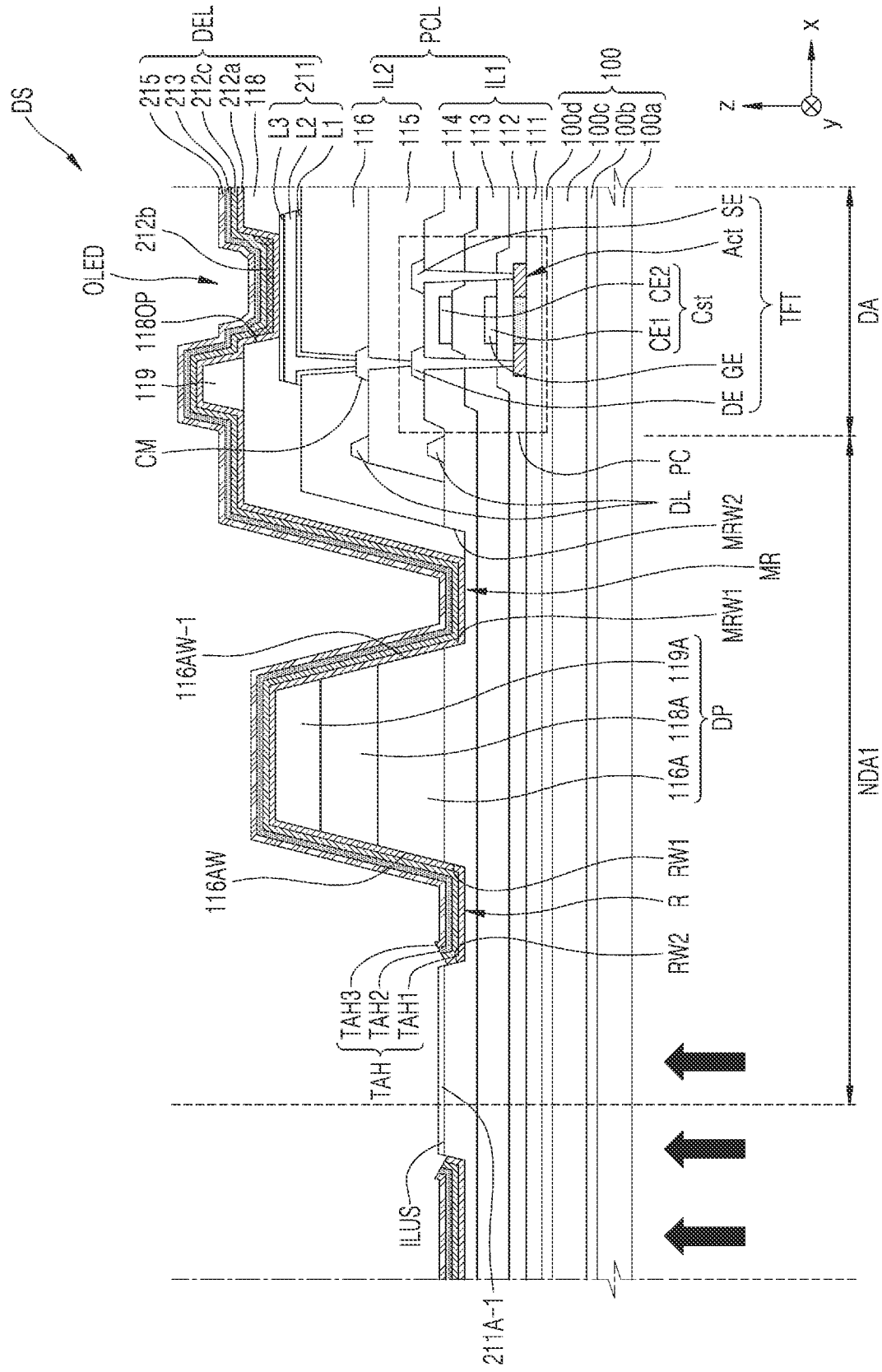

Referring to FIG. 16B, when the first layer L1 of the sacrificial pattern layer 211A includes a-Si to which a dopant is added, portions of the second layer L2 and the third layer L3 may be lifted off from the first layer L1. A portion of the first layer L1 may be the intermediate pattern layer 211A-1. Portions of the first functional layer 212a, the second functional layer 212c, the second electrode 213, and the capping layer 215 that are arranged on the third layer L3 may be lifted off along with the second layer L2 and the third layer L3. A melting point of the first layer L1 including a-Si to which a dopant is added may be higher than a melting point of the first layer L1 including Ti. Accordingly, when the first layer L1 includes a-Si to which a dopant is added, the first layer L1 may not be lifted off from the first insulating layer IL1, and an upper surface of the first layer L1 may be exposed.

A melting point of a material constituting the sacrificial pattern layer 211A may be higher than a melting point of a material constituting the second electrode 213. The first layer L1 of the sacrificial pattern layer 211A may include Ti, TiN, Mo, or doped a-Si.

If the sacrificial pattern layer 211A and the second electrode 213 include Ag, before the second electrode 213 arranged on the sacrificial pattern layer 211A is melted, the sacrificial pattern layer 211A may be lifted off and bonded to Ag of the second electrode 213, and may act as foreign matter. The foreign matter may be arranged around the sacrificial pattern layer 211A, for example, in the dam DP. The foreign matter may cause damage to the encapsulation layer ENL and may result in an inflow path for moisture. As a result, the organic light-emitting diode OLED may be damaged.

In embodiments, the sacrificial pattern layer 211A includes a material whose melting point is higher than the melting point of the second electrode 213, and thus the second electrode 213 may be melted before the sacrificial pattern layer 211A is lifted off. Therefore, unwanted damage to the encapsulation layer ENL may be prevented.

In embodiments, because the sacrificial pattern layer 211A may be formed simultaneously with the first electrode 211, a process time may be shortened, and a total number of mask processes may be minimized.

Figure 17:
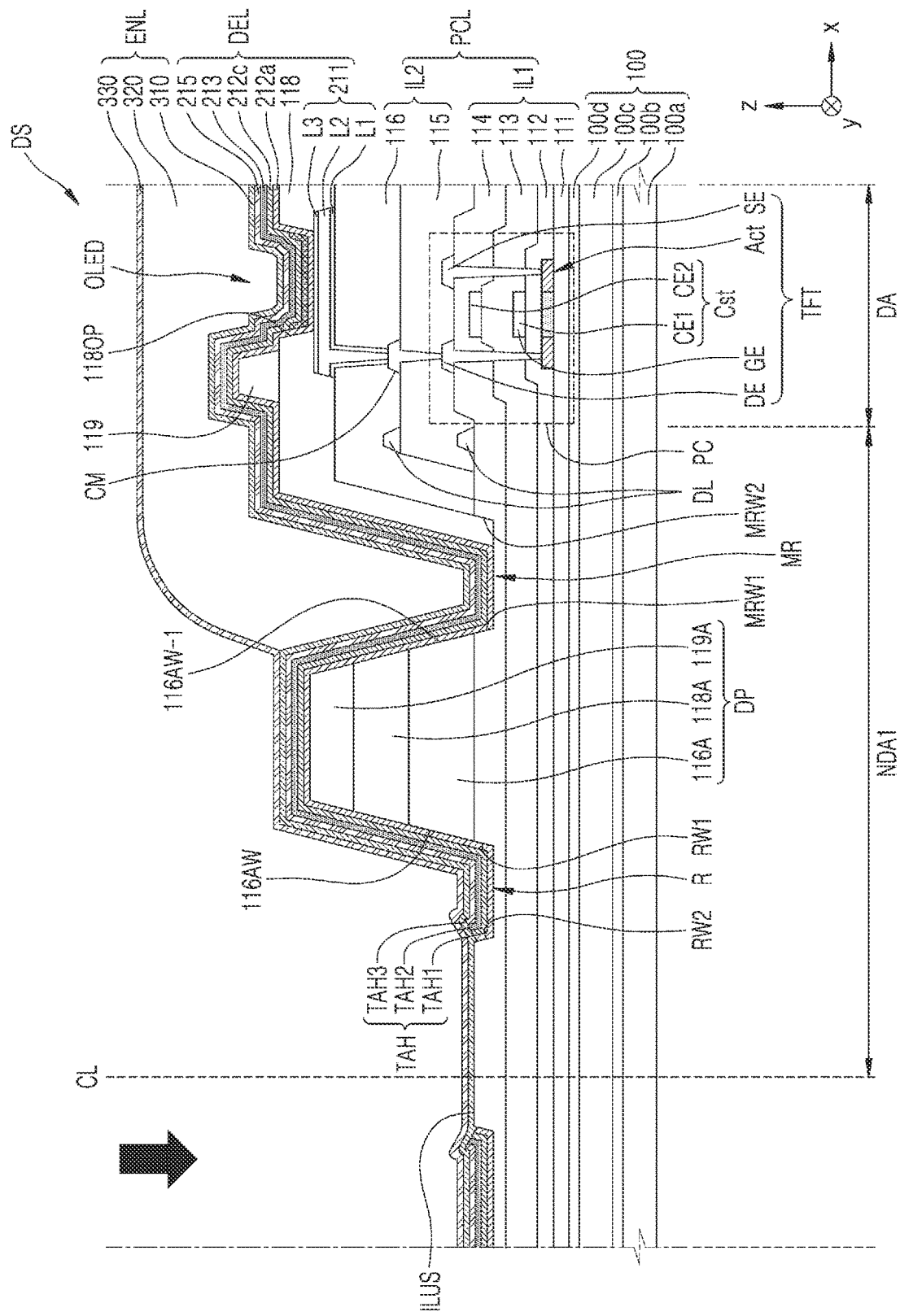
Figure 18:
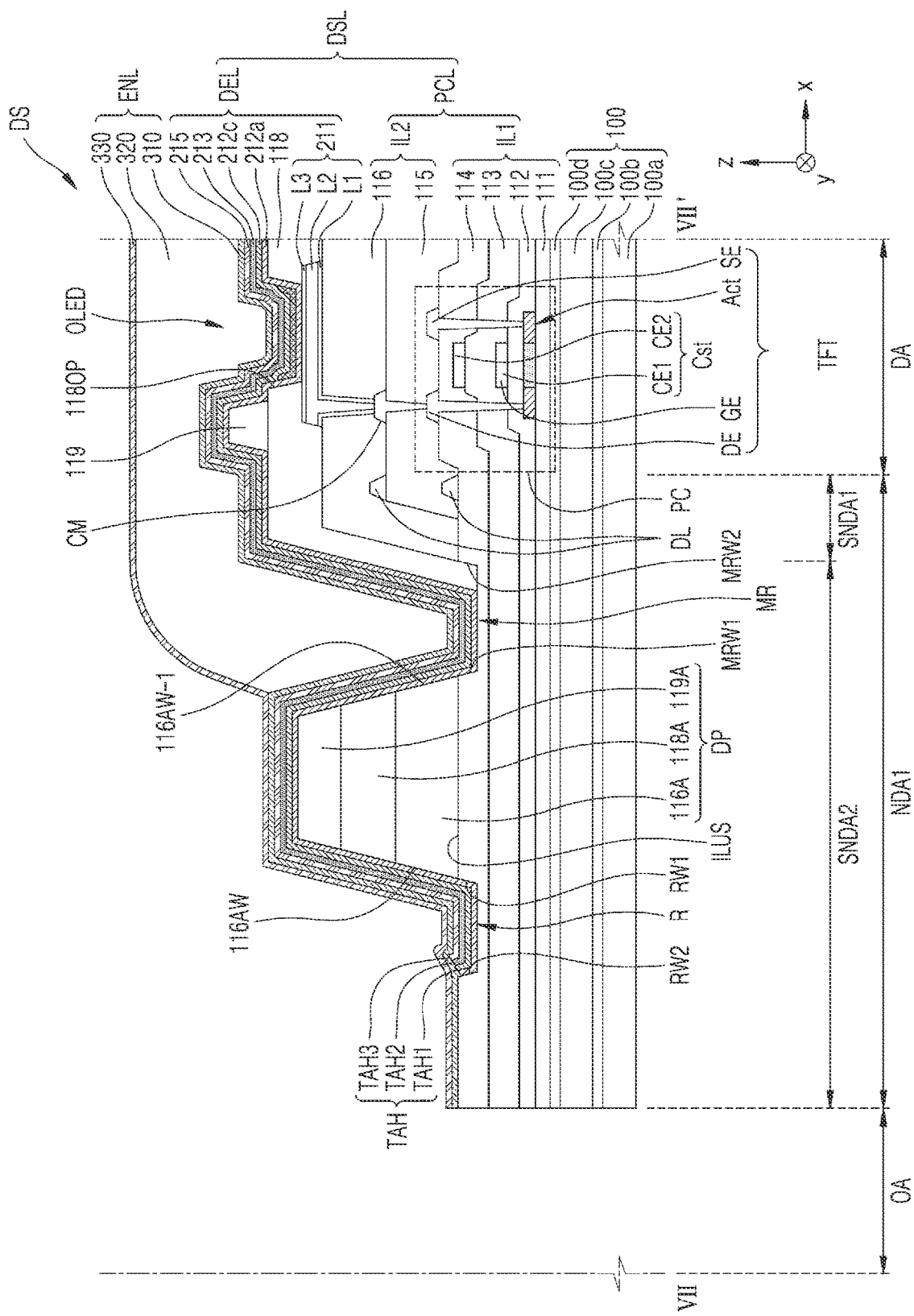

Subsequently, referring to FIGS. 17 and 18, the encapsulation layer ENL may be formed. The encapsulation layer ENL may include the first inorganic encapsulation layer 310, the organic encapsulation layer 320, and the second inorganic encapsulation layer 330. The first inorganic encapsulation layer 310 and the second inorganic encapsulation layer 330 may extend from the display area DA to the through hole TAH and may overlap the through hole TAH. Accordingly, the first inorganic encapsulation layer 310 may contact the upper surface ILUS of the first insulating layer IL1. The first inorganic encapsulation layer 310 may contact the interlayer insulating layer 114 which is an inorganic insulating layer.

Subsequently, the opening area OA may be formed by partially removing the substrate 100 and the first insulating layer IL1 along a cutting line CL (e.g., using a laser). Because the first functional layer 212a, the second functional layer 212c, the second electrode 213, and the capping layer 215 are not exposed by the opening area OA, penetration of moisture through at least one of the first functional layer 212a and the second functional layer 212c may be prevented or reduced.

Figure 19:
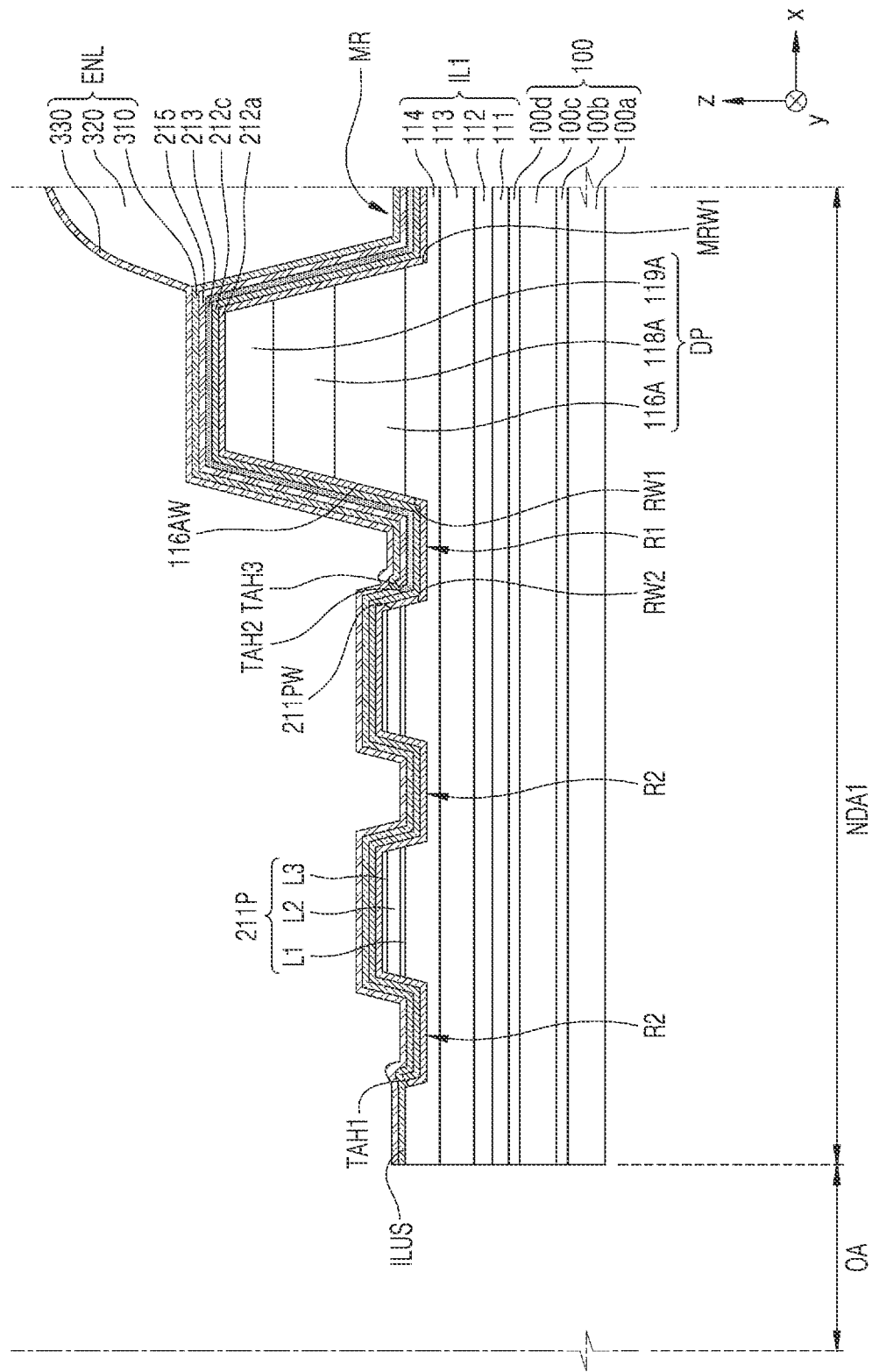
FIG. 19 is a schematic cross-sectional view of a portion of a display device according to an embodiment.

FIG. 19 is a schematic cross-sectional view of a portion of a display device according to an embodiment. In FIG. 19, the same reference numerals as those in FIG. 7A refer to the same members or analogous members.

Referring to FIG. 19, the display device may include the substrate 100, the first insulating layer IL1, the dam DP, a pattern layer 211P, and the encapsulation layer ENL. The display panel may include the capping layer 215. The substrate 100 may include the opening area OA and the first non-display area NDA1 surrounding the opening area OA.

The first insulating layer IL1 may include a recess indented in the first non-display area NDA1 in a depth/thickness direction. A plurality of recesses may be provided in the first non-display area NDA1. For example, the recesses may include a first recess R1 and a second recess R2. The first recess R1 may include a bottom surface, a first side wall RW1, and a second side wall RW2. The second recess R2 may be spaced apart from the first recess R1. The second recess R2 may be between the first recess R1 and the opening area OA. One or more second recesses R2 may be provided in the first insulating layer IL1 and between the first recess R1 and the opening area OA.

The dam DP may protrude from the upper surface ILUS of the first insulating layer IL1. The dam DP may include the organic pattern layer 116A, the first upper organic pattern layer 118A, and the second upper organic pattern layer 119A. The first side wall RW1 of the first recess R1 may be in contact with (and/or directly connected to) the dam DP. For example, the first side wall RW1 of the first recess R1 may be in contact with (and/or directly connected to) the side wall 116AW of the organic pattern layer 116A.

The pattern layer 211P may be between the opening area OA and the dam DP. The pattern layer 211P may be between the opening area OA and the organic pattern layer 116A. One or more recesses may surround the pattern layer 211P. The pattern layer 211P may be between the first recess R1 and one of the second recesses R2. The pattern layer 211P may be arranged between two second recesses R2. A side walls of a recess may be in contact with (and/or directly connected to) a side wall 211PW of the pattern layer 211P. For example, the second side wall RW2 of the first recess R1 may be in contact with (and/or directly connected to) the side wall 211PW of the pattern layer 211P. The pattern layer 211P may include the same material as the first electrode (e.g., 211 shown in FIG. 7A). The pattern layer 211P may include the first layer L1, the second layer L2, and the third layer L3.

The first layer L1 may include Ti. The first layer L1 may include TiN. The first layer L1 may include Mo. The first layer L1 may include doped a-Si, or a-Si to which a dopant is added. The dopant may be/include at least one of B, P, N, Ni, Co, and F. The second layer L2 may include a reflective layer including Ag, Mg, Al, Pt, Pd, Au, Ni, Nd, Ir, Cr, or a compound or alloy thereof. The third layer L3 may include a conductive oxide such as ITO, IZO, ZnO, $In_2O_3$, IGO, or AZO.

The pattern layer 211P may further include the lower layer LL (see FIG. 8A) including TiN under the first layer L1. The pattern layer 211P may further include the intermediate layer ML (see FIG. 8B) including a conductive oxide between the first layer L1 and the second layer L2.

The organic light-emitting diode (e.g., OLED shown in FIG. 7A) may include a first electrode, an emission layer, and (a portion of) the second electrode 213. The first electrode may include a first layer L1, a second layer L2, and a third layer L3 in the same manner as the pattern layer 211P. The first functional layer 212a may be between the first electrode and the emission layer. The second functional layer 212c may be between the emission layer and the second electrode 213. At least one of the first functional layer 212a, the second functional layer 212c, and the second electrode 213 may extend from the display area to the first non-display area NDA1.

At least one of the first functional layer 212a and the second functional layer 212c may extend from the first recess R1 to a second recess R2 and may be arranged in the second recess R2. At least one of the first functional layer 212a and the second functional layer 212c may cover the first side wall RW1 and the second side wall RW2 of the first recess R1. At least one of the first functional layer 212a and the second functional layer 212c may cover the pattern layer 211P and may include a portion arranged in the second recess R2. At least one of the first functional layer 212a and the second functional layer 212c may include the first through hole TAH1 that exposes the upper surface ILUS of the first insulating layer IL1.

The second electrode 213 and the capping layer 215 may extend from the display area to the first non-display area NDA1. The second electrode 213 may include the second through hole TAH2 that exposes the upper surface ILUS of the first insulating layer IL1. The capping layer 215 may include the third through hole TAH3 that exposes the upper surface ILUS of the first insulating layer IL1. The second through hole TAH2 and the third through hole TAH3 may expose the pattern layer 211P.

An area of the first through hole TAH1 may be less than an area of the second through hole TAH2 or an area of the third through hole TAH3. An end/edge of at least one of the first functional layer 212a and the second functional layer 212c may be closer to the opening area OA than an end/edge of one of the second electrode 213 and the capping layer 215 is.

The first inorganic encapsulation layer 310 and the second inorganic encapsulation layer 330 may cover the first side wall RW1 and the second side wall RW2 of the first recess R1, and may extend from the first recess R1 to the second recess R2. The first inorganic encapsulation layer 310 and the second inorganic encapsulation layer 330 may cover the pattern layer 211P. The first inorganic encapsulation layer 310 and the second inorganic encapsulation layer 330 may extend from the second recess R2 to an edge of the opening area OA. The first inorganic encapsulation layer 310 and the second inorganic encapsulation layer 330 may directly contact the upper surface ILUS of the first insulating layer IL1.

At least one of the first functional layer 212a and the second functional layer 212c may cover multiples surfaces of the first recess R1, the second recess R2, and the pattern layer 211P. A path through which moisture or foreign matter penetrates into the organic light-emitting diode through at least one of the first functional layer 212a and the second functional layer 212c may be lengthened. Accordingly, penetration of the moisture or foreign matter into the organic light-emitting diode may be prevented or reduced.

Figure 20A:
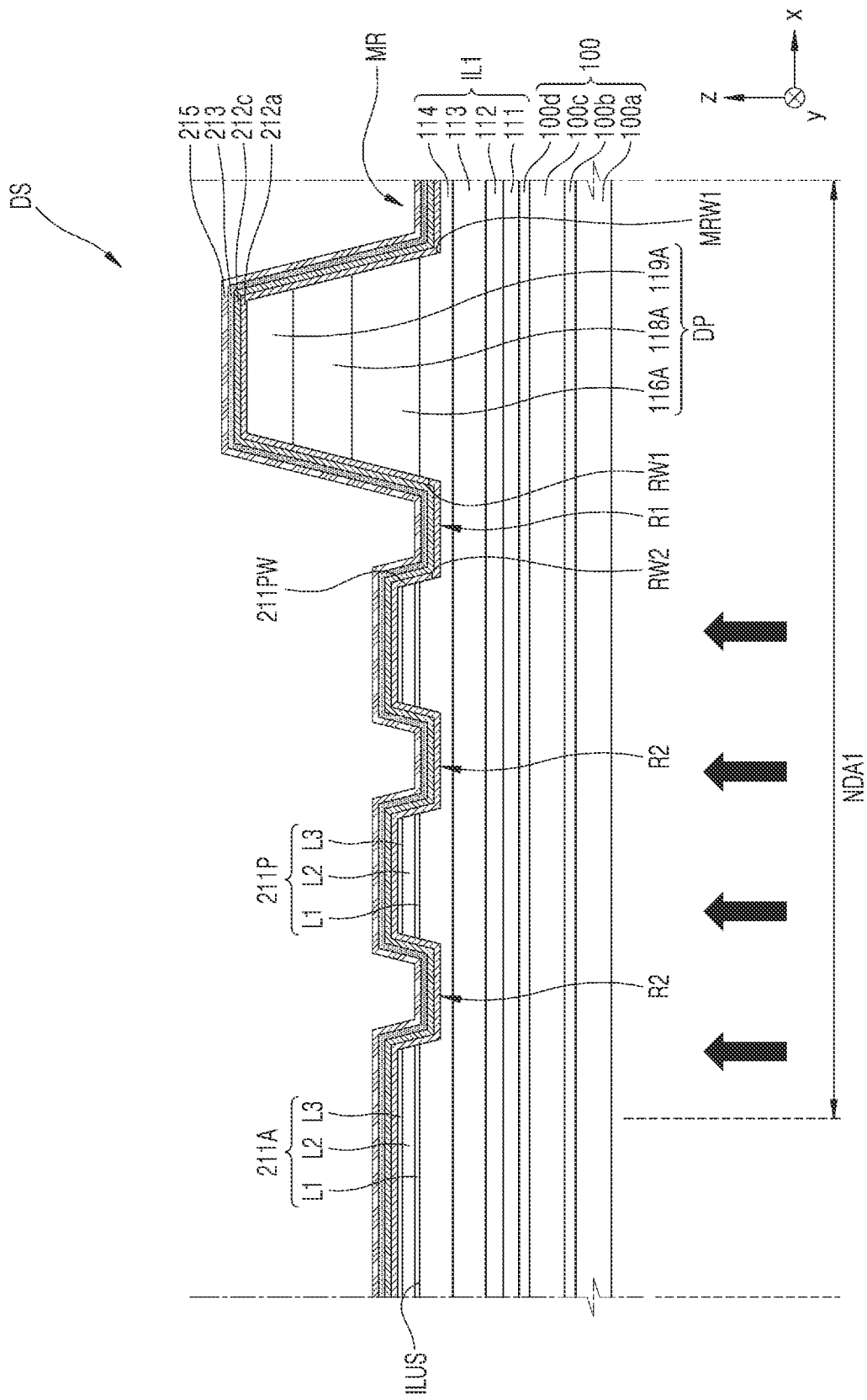
FIG. 20A, FIG. 20B, and FIG. 20C are schematic cross-sectional views of structures formed in a method of manufacturing a display device according an embodiment.
Figure 20B:
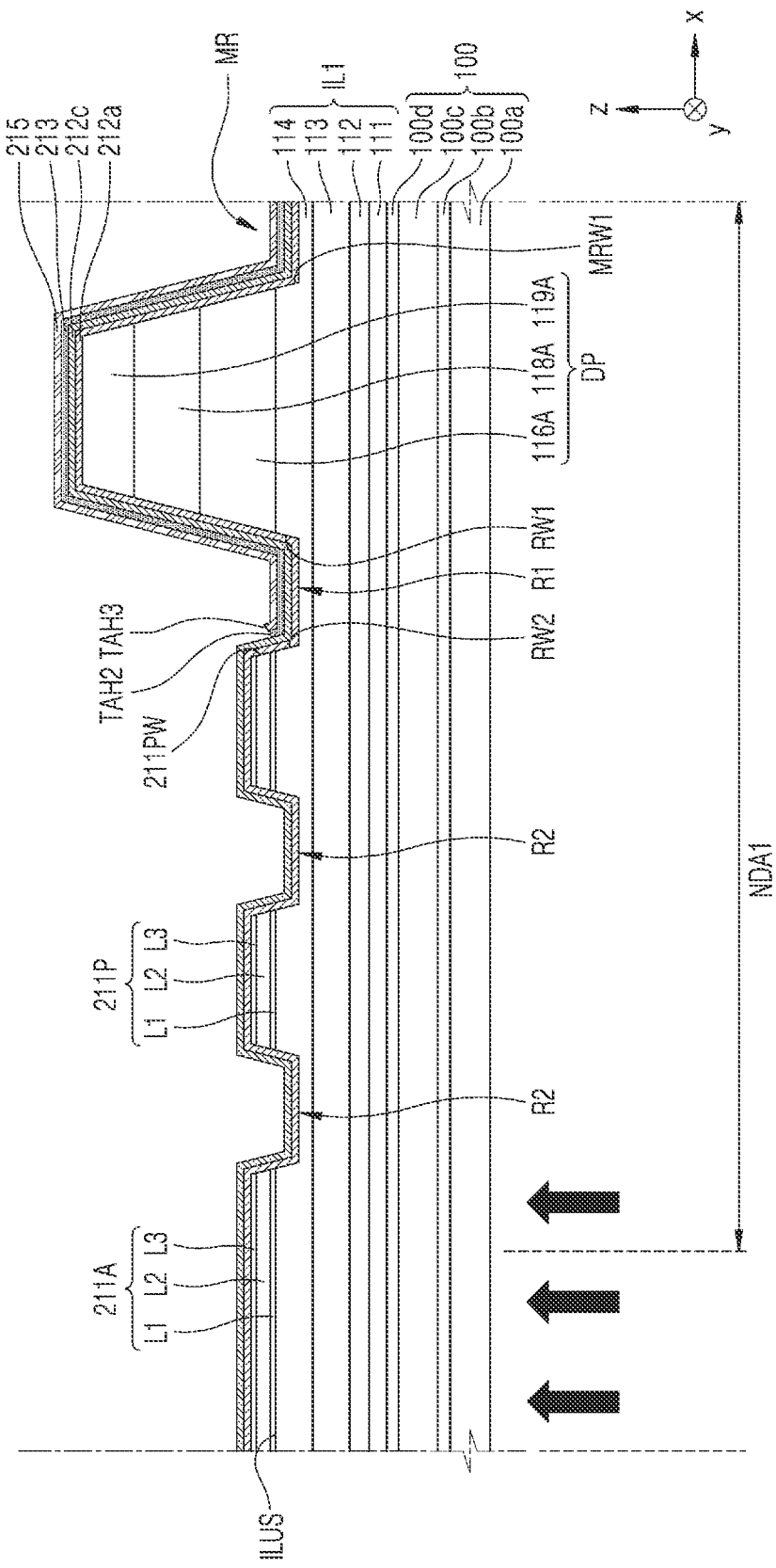
Figure 20C:
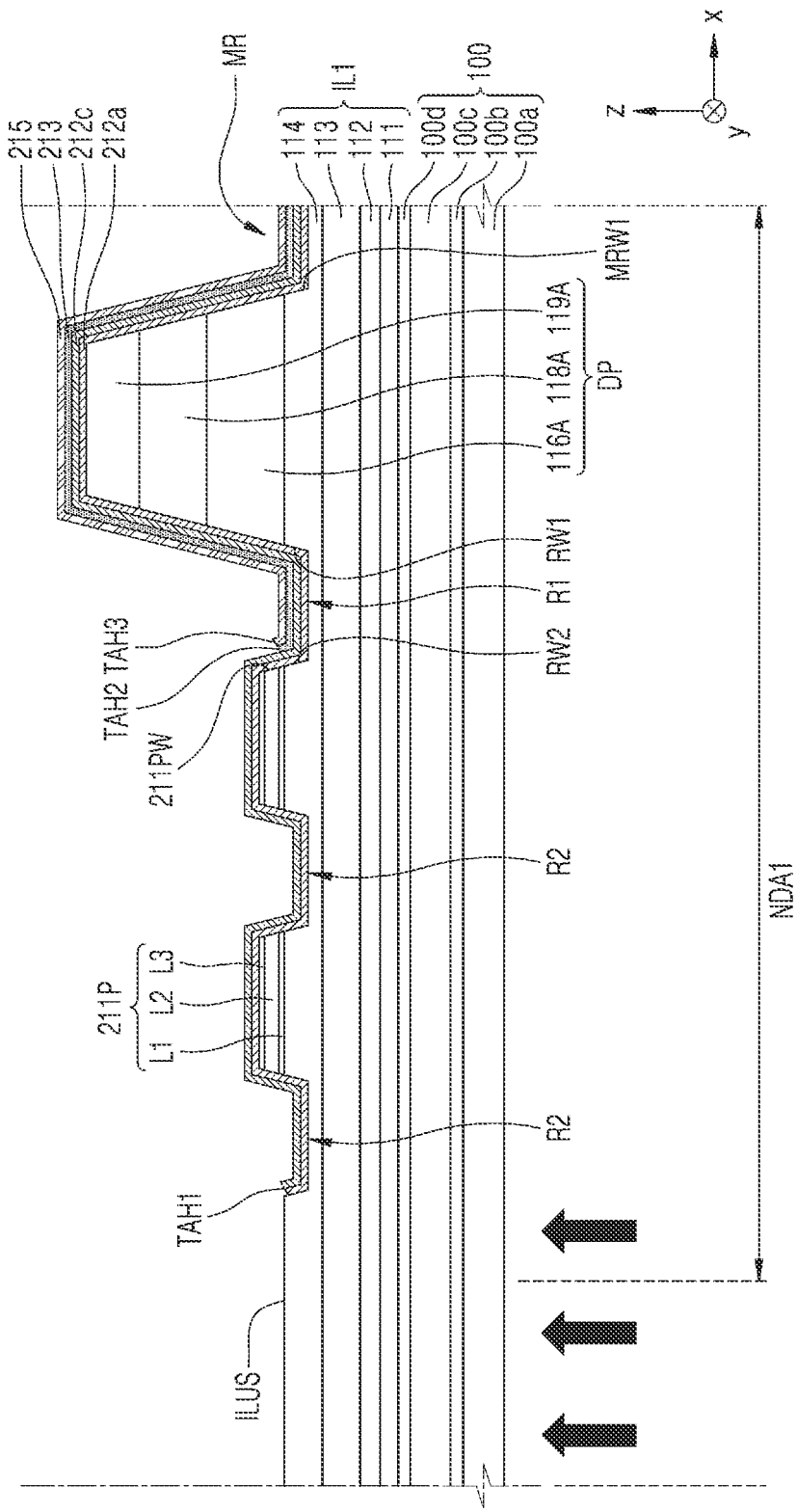

FIGS. 20A to 20C are schematic cross-sectional views of structures formed in a method of manufacturing a display device according one or more embodiments. In FIGS. 20A to 20C, the same members or analogous members as those of FIG. 19 are denoted by the same reference numerals.

Referring to FIG. 20A, the display substrate DS may be prepared. The display substrate DS may include the substrate 100 and the first insulating layer IL1 arranged on the substrate 100. The first electrode (e.g., 211 shown in FIG. 7A) overlapping the display area may be formed on the first insulating layer IL1, and the sacrificial pattern layer 211A overlapping the first non-display area NDA1 may be formed simultaneously with the first electrode.

A pattern layer 211P (or path-lengthening layer 211P) may be formed simultaneously with the first electrode. The pattern layer 211P may be formed simultaneously with the sacrificial pattern layer 211A. The pattern layer 211P may be between the sacrificial pattern layer 211A and the dam DP. The pattern layer 211P may be spaced apart from the sacrificial pattern layer 211A. One or more pattern layers 211P may be formed on the first insulating layer IL1 and between the sacrificial pattern layer 211A and the dam DP.

The pattern layer 211P may include the same material as the sacrificial pattern layer 211A. The pattern layer 211P may include the first layer L1, the second layer L2, and the third layer L3 in the same manner as the sacrificial pattern layer 211A.

When the pattern layer 211P and the sacrificial pattern layer 211A are formed, at least one recess may be formed by over-etching the first insulating layer IL1. A plurality of recesses may be formed in the first insulating layer IL1. One or more recesses may surround the pattern layer 211P and the sacrificial pattern layer 211A. A first recess R1 may be between a pattern layer 211P and the dam DP. A second recess R2 may be between two pattern layers 211P. A second recess R2 may be between a pattern layer 211P and the sacrificial pattern layer 211A.

Subsequently, at least one of the first functional layer 212a and the second functional layer 212c, and the second electrode 213 may be formed on the sacrificial pattern layer 211A and the pattern layer(s) 211P. The capping layer 215 may be formed on the second electrode 213. At least one of the first functional layer 212a and the second functional layer 212c may be continuously formed in the first non-display area NDA1. Accordingly, at least one of the first functional layer 212a and the second functional layer 212c may cover the dam DP, the first recess R1, the second recess R2, the pattern layer(s) 211P, the sacrificial pattern layer 211A, and the first insulating layer IL1. The second electrode 213 and the capping layer 215 may be continuously formed in the first non-display area NDA1 and cover the dam DP, the first recess R1, the second recess R2, the pattern layer(s) 211P, the sacrificial pattern layer 211A, and the first insulating layer IL1.

Subsequently, referring to FIGS. 20A and 20B, portions of the second electrode 213 and the capping layer 215 arranged on the pattern layer 211P may be removed. In an embodiment, laser light (a first laser light set) may be irradiated onto the first non-display area NDA1 at a first energy density (J/cm$^2$). The laser light may be irradiated in the thickness direction of the substrate 100 from the lower surface of the substrate 100. The laser light having the first energy density may be used to lift off portions of the second electrode 213 and the capping layer 215, but not the pattern layer 211P. The portions of the second electrode 213 and the capping layer 215 arranged on the pattern layer 211P may be removed. When the laser light having the first energy density is also irradiated to a lower portion of the sacrificial pattern layer 211A, the portions of the second electrode 213 and the capping layer 215 arranged on the sacrificial pattern layer 211A may be removed. Accordingly, the second through hole TAH2 that exposes a portion of the second functional layer 212c may be formed in the second electrode 213. The third through hole TAH3 that exposes a portion of the second functional layer 212c may be formed in the capping layer 215.

Subsequently, referring to FIG. 20C, portions of at least one of the first functional layer 212a and the second functional layer 212c that are arranged on the sacrificial pattern layer 211A may be removed (i.e., the second electrode 213 and the capping layer 215, which are arranged on the pattern layer 211P, may be removed). In an embodiment, laser light (a second laser light set) may be irradiated into the sacrificial pattern layer 211A at a second energy density (J/cm$^2$). The second energy density may be greater than the first energy density. Accordingly, the laser light having the second energy density may lift off the sacrificial pattern layer 211A from the first insulating layer IL1. The sacrificial pattern layer 211A and portions of at least one of the first functional layer 212a and the second functional layer 212c that which are arranged on the sacrificial pattern layer 211A may be lifted off from the first insulating layer IL1. Accordingly, the first through hole TAH1 that exposes a portion of the upper surface ILUS of the first insulating layer IL1 may be formed in the first functional layer 212a and the second functional layer 212c.

The area of the second through hole TAH2 and/or the area of the third through hole TAH3 may be greater than the area of the first through hole TAH1. Therefore, a path for penetrating into the organic light-emitting diode through at least one of the first functional layer 212a and the second functional layer 212c may be lengthened.

According to embodiments, a portion of an organic layer arranged around an opening may be removed using a laser lift-off method, for preventing display elements from being damaged by moisture or foreign matter.

The described example embodiments are illustrative and not for purposes of limitation. Descriptions of features related to each embodiment should typically be applicable for other embodiments. Various changes in form and details may be made in the described embodiments without departing from the scope defined by the following claims.

What is claimed is:
1. A display device comprising:
   a substrate including an opening area, a display area surrounding the opening area, and a non-display area between the opening area and the display area;
   a first insulating layer arranged on the substrate and including a first recess indented in a depth direction in the non-display area, the first recess comprising:
      a bottom surface within the first insulating layer and below an upper surface of the first insulating layer; and
      a first side wall connecting the upper surface to the bottom surface;

an organic pattern layer arranged on the upper surface of the first insulating layer in the non-display area and including a side wall directly connected to a-the first side wall of the first recess; and a display element arranged on the first insulating layer to overlap the display area and including a first electrode, an emission layer, and a second electrode that are sequentially stacked, wherein the first electrode includes a first layer, a second layer, and a third layer that are sequentially stacked, and the first layer includes at least one of titanium (Ti), titanium nitride (TiN), molybdenum (Mo), and amorphous silicon (a-Si) to which a dopant is added.

2. A display device comprising:
a substrate including an opening area, a display area surrounding the opening area, and a non-display area between the opening area and the display area;
a first insulating layer arranged on the substrate and including a first recess indented in a depth direction in the non-display area;
an organic pattern layer arranged on an upper surface of the first insulating layer in the non-display area and including a side wall in contact with a first side wall of the first recess; and
a display element arranged on the first insulating layer to overlap the display area and including a first electrode, an emission layer, and a second electrode that are sequentially stacked,
wherein the first electrode includes a first layer, a second layer, and a third layer that are sequentially stacked,
the first layer includes at least one of titanium (Ti), titanium nitride (TiN), molybdenum (Mo), and amorphous silicon (a-Si) to which a dopant is added, wherein the display element includes at least one of a first functional layer between the first electrode and the emission layer, and a second functional layer between the emission layer and the second electrode, and
the at least one of the first functional layer and the second functional layer, and the second electrode extend from the display area to the first side wall and are arranged in the first recess and respectively include a first through hole and a second through hole, each of which exposes a portion of the upper surface of the first insulating layer.

3. The display device of claim 2, further comprising a pattern layer arranged between the opening area and the organic pattern layer, the pattern layer including the first layer, the second layer, and the third layer, and
wherein the first insulating layer further includes a second recess spaced apart from the first recess and indented in the depth direction,
the pattern layer is between the first recess and the second recess, and
the at least one of the first functional layer and the second functional layer extends from the first recess to the second recess and is arranged in the second recess.

4. The display device of claim 2, further comprising a capping layer arranged on the second electrode, wherein the capping layer extends from the display area to the first side wall and is arranged in the first recess,
wherein the capping layer includes a third through hole that exposes a portion of the upper surface of the first insulating layer.

5. The display device of claim 2, further comprising an encapsulation layer covering the display element and including a first inorganic encapsulation layer, an organic encapsulation layer, and a second inorganic encapsulation layer,
wherein the first inorganic encapsulation layer and the second inorganic encapsulation layer extend from the display area to the non-display area, and overlap the first through hole and the second through hole, respectively.

6. A display device comprising:
a substrate including an opening area, a display area surrounding the opening area, and a non-display area between the opening area and the display area;
a first insulating layer arranged on the substrate and including a first recess indented in a depth direction in the non-display area;
an organic pattern layer arranged on an upper surface of the first insulating layer in the non-display area and including a side wall in contact with a first side wall of the first recess; and
a display element arranged on the first insulating layer to overlap the display area and including a first electrode, an emission layer, and a second electrode that are sequentially stacked,
wherein the first electrode includes a first layer, a second layer, and a third layer that are sequentially stacked,
the first layer includes at least one of titanium (Ti), titanium nitride (TiN), molybdenum (Mo), and amorphous silicon (a-Si) to which a dopant is added; and
a second insulating layer arranged between the first insulating layer and the first electrode and separated from the organic pattern layer,
wherein the organic pattern layer includes a same material as the second insulating layer.

7. A display device comprising:
a substrate including an opening area, a display area surrounding the opening area, and a non-display area between the opening area and the display area;
a first insulating layer arranged on the substrate and including a first recess indented in a depth direction in the non-display area;
an organic pattern layer arranged on an upper surface of the first insulating layer in the non-display area and including a side wall in contact with a first side wall of the first recess; and
a display element arranged on the first insulating layer to overlap the display area and including a first electrode, an emission layer, and a second electrode that are sequentially stacked,
wherein the first electrode includes a first layer, a second layer, and a third layer that are sequentially stacked, and
wherein the first layer includes titanium (Ti), and
the first electrode further includes a lower layer under the first layer, the lower layer including titanium nitride (TiN).

8. The display device of claim 1, wherein the first recess is arranged closer to the opening area than the organic pattern layer is.

9. The display device of claim 1, further comprising a component overlapping the opening area.

10. A display device comprising:
a substrate including an opening area, a display area surrounding the opening area, and a non-display area between the opening area and the display area;
a first insulating layer arranged on the substrate;

a display element arranged on the first insulating layer to overlap the display area and including a first electrode, an emission layer, and a second electrode that are sequentially stacked;

an encapsulation layer covering the display element and extending from the display element to the non-display area, the encapsulation layer including a first inorganic encapsulation layer, an organic encapsulation layer, and a second inorganic encapsulation layer; and an intermediate pattern layer overlapping the non-display area and arranged between the first insulating layer and the encapsulation layer, wherein the first electrode and the intermediate pattern layer each include amorphous silicon (a-Si) to which a dopant is added.

11. The display device of claim 10, wherein the display element includes at least one of a first functional layer between the first electrode and the emission layer, and a second functional layer between the emission layer and the second electrode, and the at least one of the first functional layer and the second functional layer, and the second electrode extend from the display area to the non-display area and respectively include a first through hole and a second through hole that expose the intermediate pattern layer.

\* \* \* \* \*